(12) United States Patent
Chen et al.

(10) Patent No.: US 11,508,887 B2
(45) Date of Patent: Nov. 22, 2022

(54) PACKAGE AND DISPLAY MODULE

(71) Applicants: EPISTAR CORPORATION, Hsinchu (TW); Yenrich Technology Corporation, Hsinchu (TW)

(72) Inventors: Shau-Yi Chen, Hsinchu (TW); Tzu-Yuan Lin, Hsinchu (TW); Wei-Chiang Hu, Hsinchu (TW); Pei-Hsuan Lan, Hsinchu (TW); Min-Hsun Hsieh, Hsinchu (TW)

(73) Assignees: Epistar Corporation, Hsinchu (TW); Yenrich Technology Corporation, Hsinchu (TW)

( * ) Notice: Subject to any disclaimer, the term of this patent is extended or adjusted under 35 U.S.C. 154(b) by 0 days.

(21) Appl. No.: 16/882,412

(22) Filed: May 22, 2020

(65) Prior Publication Data
US 2020/0373469 A1 Nov. 26, 2020

Related U.S. Application Data

(60) Provisional application No. 62/888,470, filed on Aug. 17, 2019, provisional application No. 62/852,826, filed on May 24, 2019.

(51) Int. Cl.
*H01L 33/58* (2010.01)
*H01L 33/62* (2010.01)
*H01L 27/15* (2006.01)

(52) U.S. Cl.
CPC ............ *H01L 33/58* (2013.01); *H01L 27/156* (2013.01); *H01L 33/62* (2013.01)

(58) Field of Classification Search
CPC ....... H01L 33/58; H01L 33/62; H01L 27/156; H01L 33/52; H01L 25/0753; G09F 9/33
See application file for complete search history.

(56) References Cited

U.S. PATENT DOCUMENTS 5,382,811 A 1/1995 Takahashi
11,101,410 B2 * 8/2021 Hussell .................. H01L 33/50
(Continued)

FOREIGN PATENT DOCUMENTS

CN 206672555 U 11/2017
CN 107438899 A 12/2017
(Continued)

*Primary Examiner* — Victor A Mandala
(74) *Attorney, Agent, or Firm* — Patterson + Sheridan, LLP

(57) ABSTRACT

A package includes a substrate, a first light-emitting unit, a second light-emitting unit, a light-transmitting layer, and a light-absorbing layer. The substrate has a first surface and an upper conductive layer on the first surface. The first light-emitting unit and the second light-emitting unit are disposed on the upper conductive layer. The first light-emitting unit has a first light-emitting surface and a first side wall. The second light-emitting unit has a second light-emitting surface and a second side wall. The light-transmitting layer is disposed on the first surface and covers the upper conductive layer, the first light-emitting unit, and the second light-emitting unit. The light-absorbing layer is disposed between the substrate and the light-transmitting layer, covers the upper conductive layer, the first side wall, and the second side wall, and exposes the first light-emitting surface and the second light-emitting surface.

11 Claims, 17 Drawing Sheets

(56) References Cited

U.S. PATENT DOCUMENTS

| | | | |
|---|---|---|---|
| 2013/0307013 A1 | 11/2013 | Chan et al. | |
| 2014/0186979 A1 | 7/2014 | Tu et al. | |
| 2016/0093781 A1* | 3/2016 | Tamaki | H01L 33/505 |
| | | | 257/98 |
| 2016/0181476 A1* | 6/2016 | Chang | H01L 25/0753 |
| | | | 257/13 |
| 2016/0293811 A1 | 10/2016 | Hussell et al. | |
| 2016/0351539 A1* | 12/2016 | Bower | H01L 25/0655 |
| 2017/0154880 A1* | 6/2017 | Ozeki | H01L 25/167 |
| 2017/0345801 A1* | 11/2017 | Lin | H01L 33/0093 |
| 2018/0097164 A1* | 4/2018 | Katsumata | H05K 3/0038 |
| 2018/0358405 A1* | 12/2018 | Chaji | H01L 24/92 |
| 2019/0312187 A1* | 10/2019 | Harada | H01L 33/505 |
| 2019/0348482 A1* | 11/2019 | Bae | H01L 27/3246 |
| 2019/0378873 A1* | 12/2019 | Lee | H01L 33/50 |
| 2020/0044125 A1* | 2/2020 | Chen | H01L 33/58 |
| 2020/0203419 A1* | 6/2020 | Andrews | H01L 33/007 |
| 2020/0235084 A1* | 7/2020 | Wu | H01L 25/167 |
| 2021/0167122 A1* | 6/2021 | Andrews | F21K 9/90 |

FOREIGN PATENT DOCUMENTS

| | | |
|---|---|---|
| CN | 108695304 A | 10/2018 |
| DE | 102010012602 A1 | 9/2011 |
| DE | 102010046254 A1 | 4/2012 |
| TW | 354379 B | 3/1999 |
| TW | 201729434 A | 8/2017 |
| TW | 201907586 A | 2/2019 |

* cited by examiner

PACKAGE AND DISPLAY MODULE

RELATED APPLICATION

This application claims the benefit of U.S. Provisional Application Ser. No. 62/852,826, filed on May 24, 2019, and U.S. Provisional Application Ser. No. 62/888,470, filed on Aug. 17, 2019, which are incorporated herein by reference in its.

TECHNICAL FIELD

The present disclosure relates to the structures and the manufacturing processes of a package and a display module, and especially to the structures and manufacturing processes of a package and a display module using light emitting diodes as pixels.

DESCRIPTION OF THE RELATED ART

FIG. 1 shows a display module including a base 1 and a plurality of pixel packages 2 arranged in an array and fixed on the base 1. Each pixel package 2 includes a substrate 20, a pixel 2P disposed on the substrate 20, and a light-transmitting layer 24 formed on the substrate 20 and covering the pixel 2P. The pixel 2P includes a light-emitting unit 21, a light-emitting unit 22 and a light-emitting unit 23, which can respectively emit red light, blue light, and green light. The pixel 2P can receive a control signal and emit red, blue, and green light independently for being a pixel in the display module. There is a distance d1 between the two light emitting units 21, two light emitting units 22, or two light emitting units 23 respectively in two adjacent pixels 2P. The distance d1 is determined by the size of the base 1 and the resolution of the display module. There is an aisle g1 between two adjacent pixel packages 2. The light from the pixel package 2 passes through the light-transmitting layer 24 and the aisles g1 to the adjacent pixel package 2, therefore causing the light crosstalk between the adjacent pixel packages 2 and reducing the display contrast of the display module.

SUMMARY OF THE DISCLOSURE

The following description illustrates embodiments and together with drawings to provide a further understanding of the disclosure described above.

A package includes a substrate, a first light-emitting unit, a second light-emitting unit, a light-transmitting layer, and a light-absorbing layer. The substrate has a first surface and an upper conductive layer on the first surface. The first light-emitting unit and the second light-emitting unit are disposed on the upper conductive layer. The first light-emitting unit has a first light-emitting surface and a first side wall. The second light-emitting unit has a second light-emitting surface and a second side wall. The light-transmitting layer is disposed on the first surface and covers the upper conductive layer, the first light-emitting unit, and the second light-emitting unit. The light-absorbing layer is disposed between the substrate and the light-transmitting layer. The light-absorbing layer covers the upper conductive layer, the first side wall, and the second side wall, and does not cover the first light-emitting surface and the second light-emitting surface.

DETAILED DESCRIPTION OF THE EMBODIMENTS

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the shape of an element in the specification can be expanded or narrowed.

The First Embodiment

Figure 1:
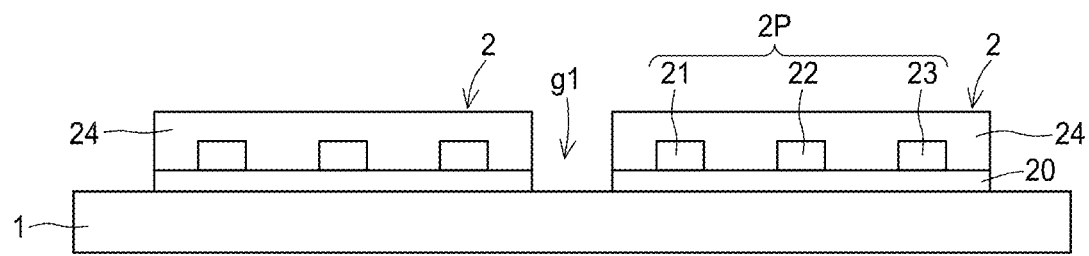
FIG. 1 shows a display module in accordance with an embodiment of the present disclosure.
Figure 2A:
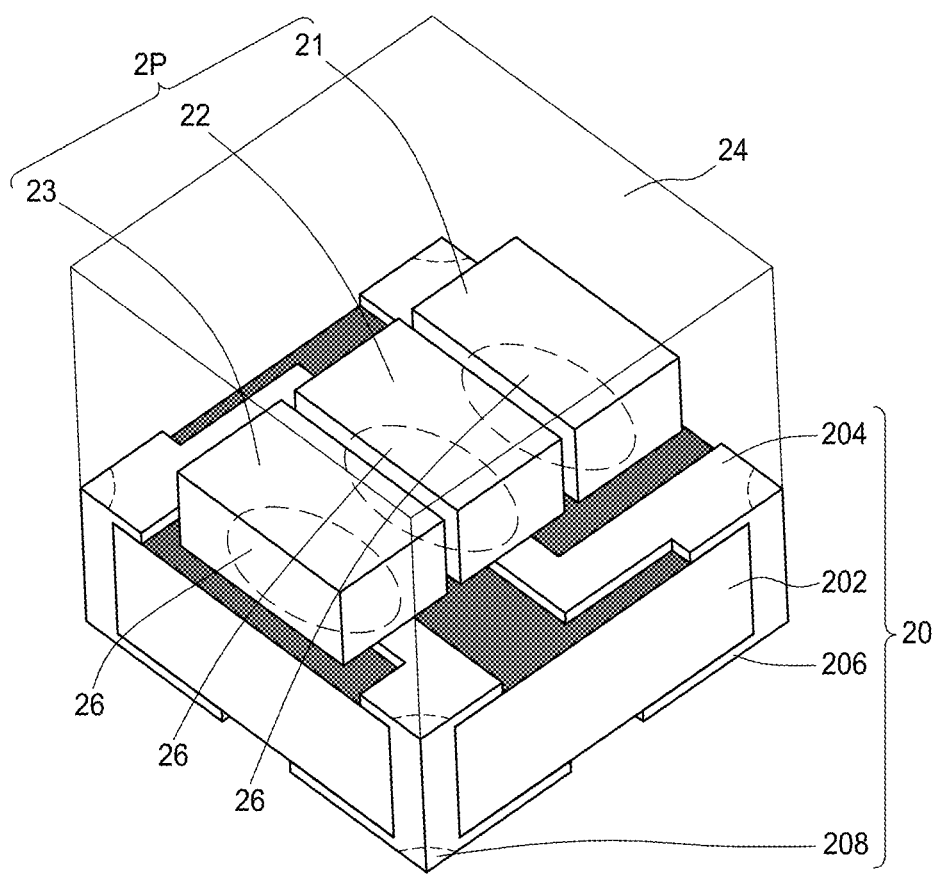
FIGS. 2A~2D show a structure of a pixel package in accordance with the first embodiment of the present disclosure.

FIGS. 2A~2D show the structure of a pixel package 2A. FIG. 2A shows the perspective view of a pixel package 2A in accordance with an embodiment of the present disclosure.

Figure 2B:
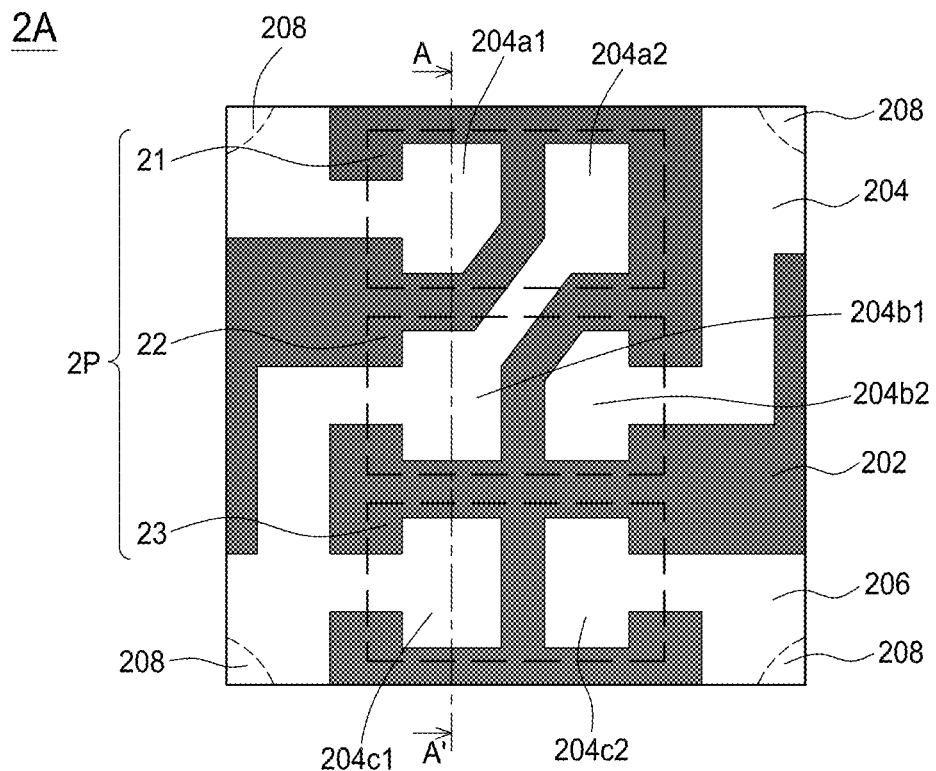
Figure 2C:
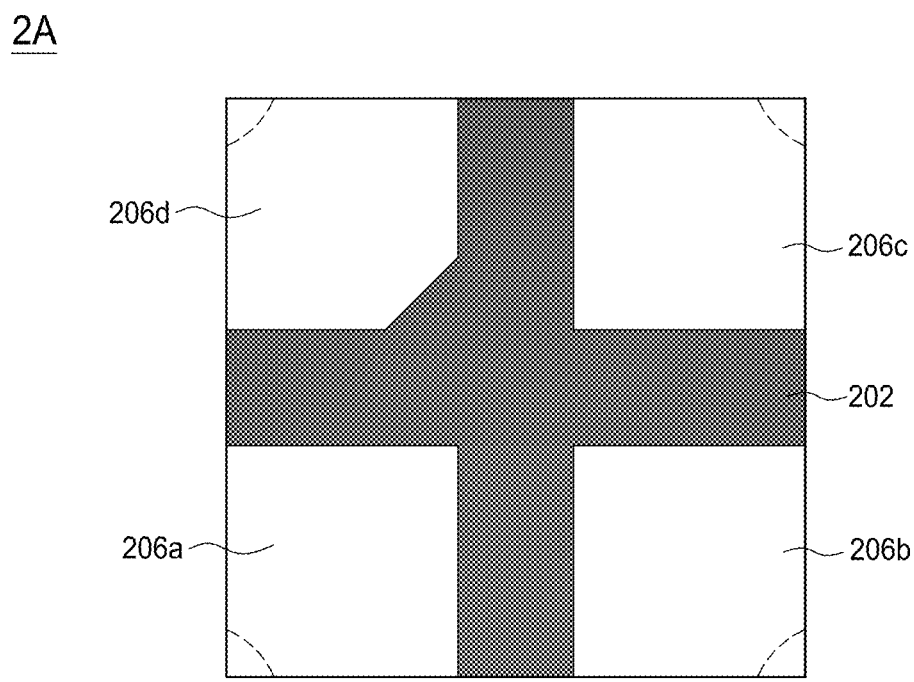
Figure 2D:
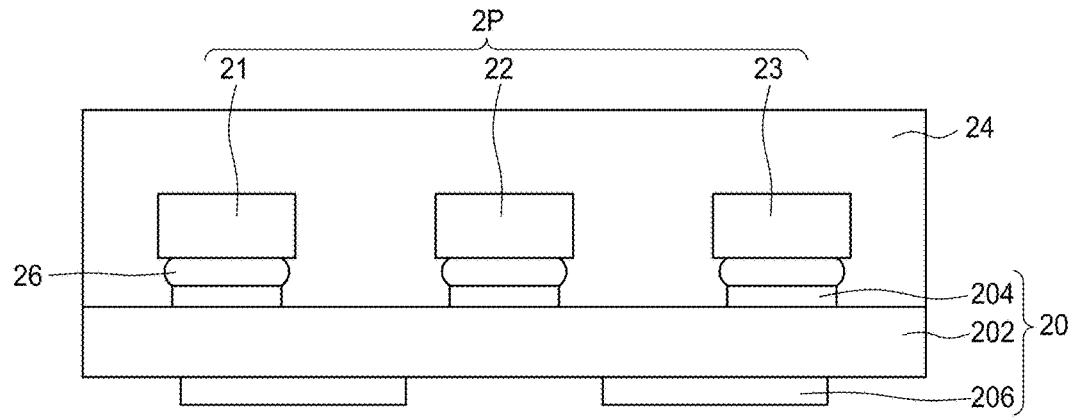

FIG. 2B shows the top view of substrate 20 shown in FIG. 2A. FIG. 2C shows the bottom view of the pixel package 2A shown in FIG. 2A. FIG. 2D shows a cross-sectional view of the pixel package 2A along the section line AA' in FIG. 2B. The pixel package 2A includes a substrate 20, a pixel 2P including a light-emitting unit 21, a light-emitting unit 22, and a light-emitting unit 23 on the substrate 20, a connecting structure 26, and a light-transmitting layer 24. In an embodiment, the substrate 20 includes an insulating layer 202, an upper conductive layer 204, a plurality of conductive vias 208, and a lower conductive layer 206. The upper conductive layer 204 can electrically connect the pixel 2P and the lower conductive layer 206. The lower conductive layer 206 is electrically connected to the external control circuit. As shown in FIG. 2B, in a top view of the substrate 20, the four conductive vias 208 are located at the corners of the substrate 20. The upper conductive layer 204 has three pairs: electrodes 204a1 and 204a2, 204b1 and 204b2, and 204c1 and 204c2, which are hammer-shaped and are electrically connected to the p-electrode and n-electrode (not shown) of the light-emitting units 21, 22, 23 respectively. The hammer-shaped electrodes 204a2, 204b1, and 204c1 are electrically connected to the same conductive via 208, and the other three hammer-shaped electrodes 204a1, 204b2, 204c2 are connected to the other three separate conductive vias 208. The upper conductive layer 204 is electrically connected to the lower conductive layer 206 through the conductive vias 208. The conductive vias 208 penetrates the insulating layer 202. In other embodiments, the conductive vias 208 can be formed at an edge, a corner, or an inner region of the insulating layer 202. In one embodiment, the upper conductive layer 204 is formed on the insulating layer 202 and has a patterned structure, and the lower conductive layer 206 is formed under the insulating layer 202 and has a patterned structure. Referring to FIG. 2C, the lower conductive layer 206 has four conductive pads 206a, 206b, 206c, 206d connected to the four conductive vias 208 respectively. The conductive pad 206d is electrically connected to the hammer-shaped electrodes 204a2, 204b1, 204c1. The conductive pad 206a is electrically connected to the hammer-shaped electrodes 204a1. The conductive pad 206b is electrically connected to the hammer-shaped electrodes 204b2. The conductive pad 206c is electrically connected to the hammer-shaped electrodes 204c2. In this embodiment, the corner of the conductive pad 206d has an incline and a shape different from the other three conductive pads 206a, 206b, and 206c for identifying the position of the conductive pad 206d.

The material of the insulating layer 202 can be epoxy resin, BT (Bismaleimide Triazine), polyimide (polyimide), composite material with epoxy resin and glass fiber, or composite material with BT resin and glass fiber. In an embodiment, the insulating layer 202 is doped with a black substance, such as carbon powder, and appears black to increase the contrast of the pixel package 2A. The materials of the upper conductive layer 204 and the lower conductive layer 206 can be metals, such as copper, tin, aluminum, silver, or gold.

Referring to FIG. 2A, in an embodiment, the light-emitting unit 21, the light-emitting unit 22, and the light-emitting unit 23 are light-emitting diode dies (LED die) that can respectively emit light with different wavelengths or different colors. In one embodiment, the light-emitting unit 21 is a red light-emitting diode, which can emit the first light by receiving a power through the power source. The dominant wavelength or peak wavelength of the first light is between 600 nm and 660 nm. The light-emitting unit 22 is a green light-emitting diode, which can emit a second light with a dominant wavelength or peak wavelength between 510 nm and 560 nm. The light-emitting unit 23 is a blue light-emitting diode, which can emit a third light with a dominant wavelength or peak wavelength is between 430 nm and 480 nm. The structures of the light-emitting unit 21, the light-emitting unit 22, and the light-emitting unit 23 are similar, but the compositions of the light-emitting layers are different from each other.

In another embodiment, the light-emitting unit 21 is a light-emitting diode which has a wavelength shorter than the red light, for example, a blue light-emitting diode or an ultraviolet light-emitting diode is covered by a wavelength conversion material which can convert the blue light or ultraviolet light into a red light. The light-emitting unit 22 is a light-emitting diode which has a wavelength shorter than the green light, for example, a blue light-emitting diode or an ultraviolet light-emitting diode is covered by a wavelength conversion material which can convert the blue light or ultraviolet light into a green light. The light-emitting unit 23 is a blue light-emitting diode or an ultraviolet light-emitting diode, and covered by a wavelength conversion material which can convert the blue light or ultraviolet light into a blue light. In another embodiment, if the light-emitting unit 23 is a blue light-emitting diode, the light-emitting unit 23 can be covered by a transparent material or is uncovered.

FIG. 2D shows a cross-sectional view of the pixel package 2A along the AA' line shown in FIG. 2B. The light-transmitting layer 24 covers the light-emitting unit 21, the light-emitting unit 22, the light-emitting unit 23, and the upper conductive layer 204 of the substrate 20. The material of the light-transmitting layer 24 includes silicone, epoxy, acrylic, or a combination thereof. In this embodiment, the transmittance of the light-transmitting layer 24 is greater than 90%. In another embodiment, the light-transmitting layer 24 can be doped with a black material, such as carbon, to reduce the transmittance of the light-transmitting layer 24 between 20% and 70% and decrease the external light from penetrating the light-transmitting layer 24 and being reflected by the upper conductive layer 204. Therefore, the contrast of the pixel package 2A is improved.

The Second Embodiment

Figure 3A:
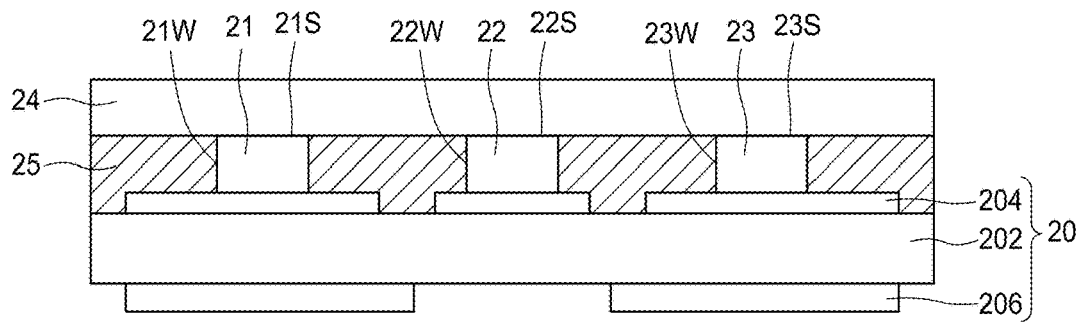
FIGS. 3A~3C show a structure of a pixel package in accordance with the second embodiment of the present disclosure.
Figure 3B:
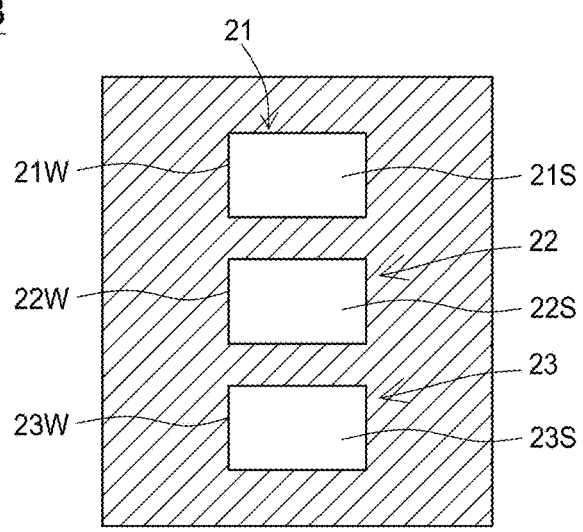

FIGS. 3A~3B show the structure of a pixel package 2B. FIG. 3A shows a cross-sectional view of the pixel package 2B and FIG. 3B shows the top view of the pixel package 2B. As shown FIG. 3A, in the cross-sectional view of the pixel package 2B, the pixel package 2B includes a light-absorbing layer 25 between the substrate 20 and the light-transmitting layer 24. The light-absorbing layer 25 covers the upper conductive layer 204 of the substrate 20 and fills up to be flush with the light-emitting surfaces 21S, 22S, 23S of the light-emitting units 21, 22, 23. In another embodiment, the uppermost surface of the light-absorbing layer 25 can be slightly lower or slightly higher than the light-emitting surfaces 21S, 22S, 23S of the light emitting units 21, 22, 23. The material of the light-absorbing layer 25 includes a matrix and a black material, wherein the matrix includes silicone, epoxy, or a combination thereof, and the black material includes carbon. The transmittance of the light-absorbing layer 25 is lower than that of the light-transmitting layer 24, or the absorbance of the light-absorbing layer 25 is higher than that of the light-transmitting layer 24. The light transmittance of the light absorption layer 25 can be close to 0% by adjusting the concentration of the black material in the matrix. That is, the light absorption layer 25 is almost or completely opaque. As shown in FIG. 3B, in the top view of the pixel package 2B, the light-absorbing layer 25 completely covers the upper conductive layer (not shown), and exposes the light-emitting surfaces 21S, 22S, 23S of the light-emitting units 21, 22, 23. Since the light-absorbing layer 25 covers the side walls 21W, 22W, 23W of the light-emitting units 21, 22, 23, the light emitted from the light-emitting units 21, 22, 23 of the pixel package 2B only exit from the light-emitting surfaces 21S, 22S, 23S. The light emitted from the side walls 21W, 22W, 23W of the light-emitting units 21, 22, 23 is blocked by the light-absorbing layer 25, therefore the light crosstalk between the light-emitting units 21, 22, 23 can be avoided. In addition, the light from outside can be blocked by the light-absorbing layer 25 and is avoided from being reflected by the upper conductive layer 204 of the substrate 20 for increasing the color purity and contrast of the pixel package 2B. The hardness of the light-absorbing layer 25 can be less than the hardness of the light-transmitting layer 24. For example, according to the measurement of shore D method, the Shore hardness of the light-absorbing layer 25 is less than 60, and the Shore hardness of the light-transmitting layer 24 is greater than 60. In another embodiment, the light-transmitting layer 24 can have a Shore hardness greater than 60 to resist scratch.

Figure 3C:
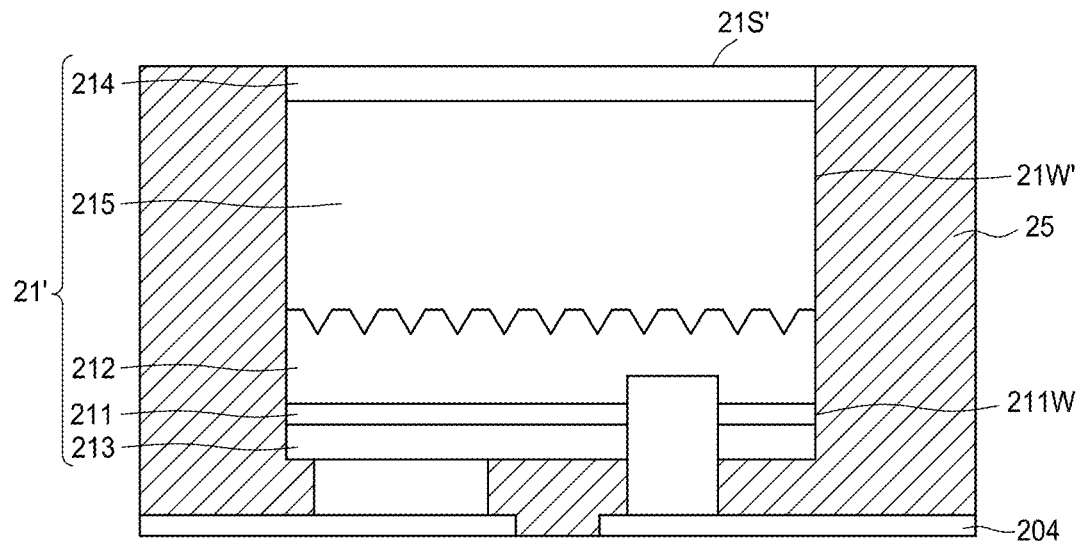

FIG. 3C shows a partially enlarged view of a light-emitting unit 21' and a light-absorbing layer 25. The light-emitting unit 21' represents any one of the aforementioned light-emitting units 21, 22, and 23. The light-emitting surface 21S' represents any one of the aforementioned light-emitting surfaces 21S, 22S, 23S. The side wall 21W' represents any one of the aforementioned side walls 21W, 22W, 23W. In one embodiment, as shown in FIG. 3C, the light-emitting unit 21 is a flip-chip. The uppermost surface of the light-absorbing layer 25 is substantially flush with the light-emitting surface 21S'. The light-emitting unit 21' includes a light-emitting layer 211, a p-type semiconductor layer 213 and a n-type semiconductor layer 212 on opposite sides of the light-emitting layer 211, and a growth substrate 215. In another embodiment, the growth substrate can be removed or thinned down. The side wall 211W of the light-emitting layer 211 is covered by the light-absorbing layer 25 so the light emitted from the light-emitting layer 211 does not directly radiate to adjacent light-emitting units and the light can only emit from the light-emitting surface 21S'. In one embodiment, in order to have a wider color gamut for display applications, the light-emitting unit 21 can optionally have a filter layer 214 on the light-emitting surface 21S' to reduce the full width at half maximum of the light to increase the color purity of the light-emitting unit 21.

The Third Embodiment

Figure 4A:
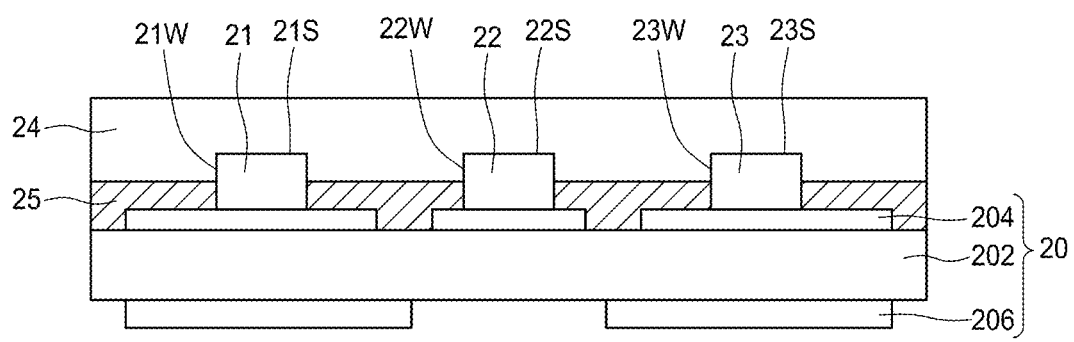
FIGS. 4A~4C show a structure of a pixel package in accordance with the third embodiment of the present disclosure.
Figure 4B:
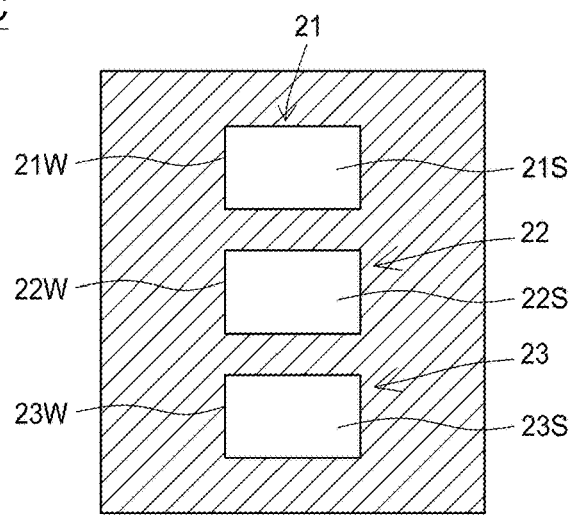
Figure 4C:
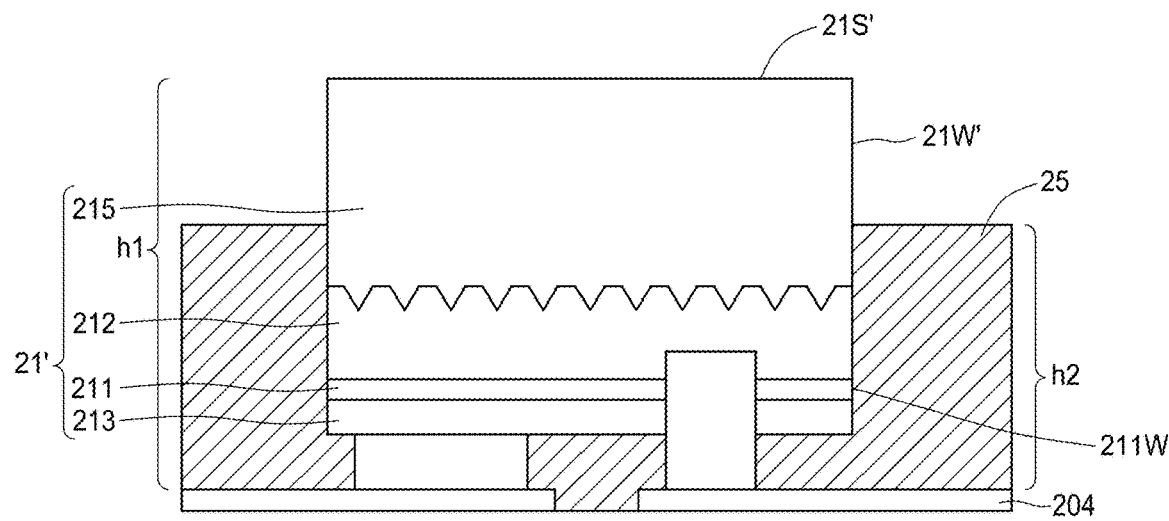

FIGS. 4A~4C show the structure of a pixel package 2C. FIG. 4A shows a cross-sectional view of the pixel package 2C, FIG. 4B shows the top view of the pixel package 2B, and FIG. 4C shows a partially enlarged schematic view of one of the light-emitting units 21, 22, and 23 in the pixel package 2C. The difference between the pixel package 2C and the aforementioned pixel package 2B is that the uppermost surface of the light-absorbing layer 25 of the pixel package 2C is lower than the light-emitting surfaces 21S, 22S, 23S of the light-emitting units 21, 22, 23. As shown in FIG. 4C, a partially enlarged view of a light-emitting unit 21' and the light-absorbing layer 25, the light-emitting unit 21' is any one of the aforementioned light-emitting units 21, 22, and 23. The uppermost surface of the light-absorbing layer 25 is lower than the light-emitting surface 21S' of the light-emitting unit 21', and a portion of the side wall 21W' is exposed. The light-emitting surface 21S' is any one of the aforementioned light-emitting surfaces 21S, 22S, 23S, and the side wall 21W' is any one of the aforementioned side walls 21W, 22W, 23W. In one embodiment, the light-emitting unit 21' has a height h1, and the light-absorbing layer 25 has a height h2, where h2<h1. In one embodiment, $0.25 \times h1 \leq h2 \leq 0.75 \times h1$. In another embodiment, the height h1 is between 10 μm and 150 μm and the height h2 is between 10 μm and 75 μm. In one embodiment, as shown in FIG. 4C which is the partially enlarged schematic view, the structure of the light-emitting unit 21' is a flip-chip. The light-emitting unit 21' includes a light-emitting layer 211, a p-type semiconductor layer 213 and a n-type semiconductor layer 212 located on opposite sides of the light-emitting layer, and a growth substrate 215. In another embodiment, the growth substrate can be removed or thinned down. The side wall 211W of the light-emitting layer 211 is covered by the light-absorbing layer 25, therefore the red, blue or green light emitted from the light-emitting layer 211 does not directly emit toward the adjacent light-emitting units. Consequently, the light can emit from a portion of the side wall 21W' and the light-emitting surface 21S'. In this embodiment, the light from the light-emitting units 21, 22, and 23 can emit from portion of the side walls 21W'. Comparing to the pixel package 2B, the portion of the light from the light-emitting units 21~23 in the pixel package 2C can be emitted out is larger. Hence, the luminous efficiency of the pixel package 2C is better, and the light crosstalk between the light-emitting units 21, 22, 23 can be avoided. Besides, the external light is blocked and avoided from penetrating the light-absorbing layer 25 to avoid from being reflected by the upper conductive layer 204 of the substrate 20. Hence, the color purity and contrast of the pixel package 2C is improved.

Figure 5:
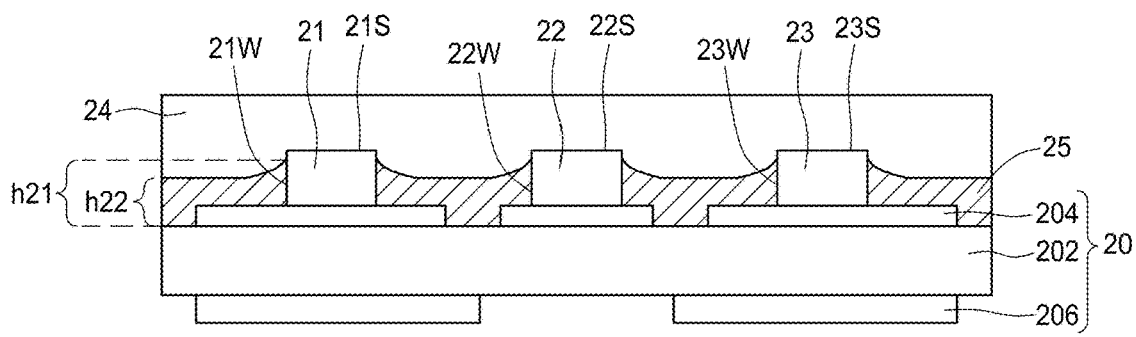
FIG. 5 shows a cross-sectional view of a structure of a pixel package in accordance with another third embodiment of the present disclosure.

FIG. 5 shows a cross-sectional view of another embodiment of the pixel package 2C. Since the light-absorbing layer 25 is affected by surface tension during the manufacturing process, the light-absorbing layer 25 has two different thicknesses h21, h22. A portion of the light-absorbing layer 25 contacting the side walls 21W, 22W, 23W of the light-emitting units 21, 22, 23 has a thickness h21, and another portion away from the light-emitting units 21, 22, 23 has a thickness h22. The thickness h21 is larger than the thickness h22.

The Fourth Embodiment

Figure 6A:
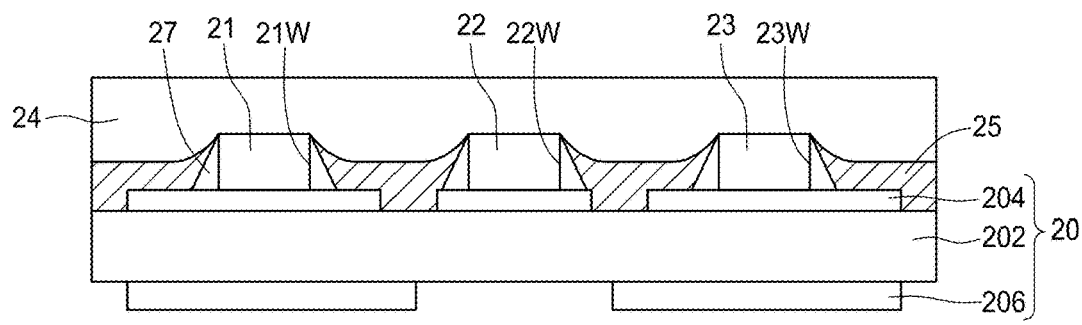
FIGS. 6A~6C show a structure of a pixel package in accordance with the fourth embodiment of the present disclosure.
Figure 6B:
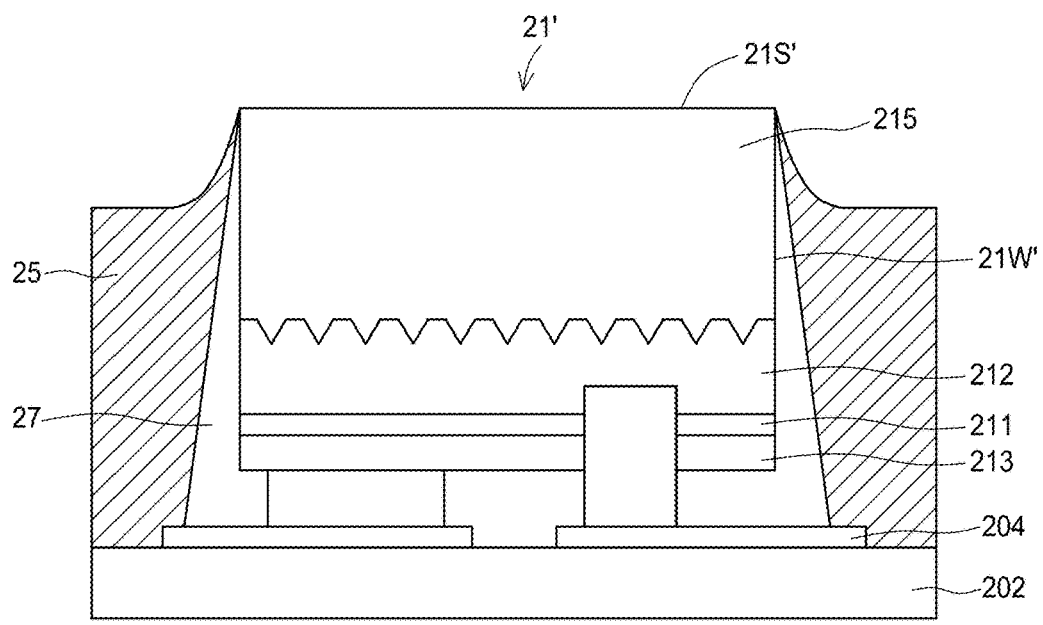
Figure 6C:
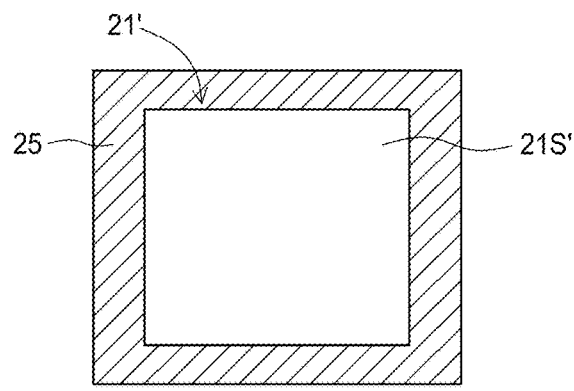

FIGS. 6A~6C show the structure of a pixel package 2D. FIG. 6A shows a cross-sectional view of the pixel package 2D. The difference between the pixel package 2D and the pixel package 2C is that a reflective wall 27 is formed on the side walls 21W, 22W, 23W of each light-emitting unit 21, 22, 23. The color of the reflective wall is white, gray, yellow, or silver. The material of the reflective wall 27 includes a matrix and a reflective material, wherein the matrix includes silicone, epoxy, or a combination thereof. The reflective material can include $TiO_x$, $SiO_x$, or a combination thereof. The light-emitting unit 21' shown in FIG. 6B is a partially enlarged schematic view of one of the light-emitting units 21, 22, and 23 of the pixel package 2D. The detailed structure of light-emitting unit 21' can be referred to the aforementioned FIG. 3C or FIG. 4C. As shown in FIG. 6B, the reflective wall 27 has a height equal to or slightly lower than that of the side wall 21W', and is used to reflect the light emitted from the light-emitting layer 211 of the light-emitting unit 21' and exit from the light-emitting surface 21S'. It is preferable that the height of the reflective wall 27 is equal to or slightly lower than that of the light absorbing layer 25 to avoid the external light being reflected by the reflective wall 27. In this embodiment, the method of applying the reflective wall 27 includes dispensing, screen printing, or inkjet printing. FIG. 6C shows a top view of the light-emitting unit 21' of FIG. 6B, the light-emitting unit 21' is surrounded by the reflective wall 27 (not shown) and the light-absorbing layer 25. Therefore, the light from the light-emitting layer 211 is reflected by the reflective wall 27 and exits from light-emitting surface 21S'. Consequently, the light efficiency of each light-emitting unit 21, 22, 23 of the pixel package 2D is improved. Since the reflective wall 27 is covered by the light-absorbing layer 25, the top view of the pixel package 2D is the same as that of the pixel package 2C shown in FIG. 4B.

The Fifth Embodiment

Figure 7:
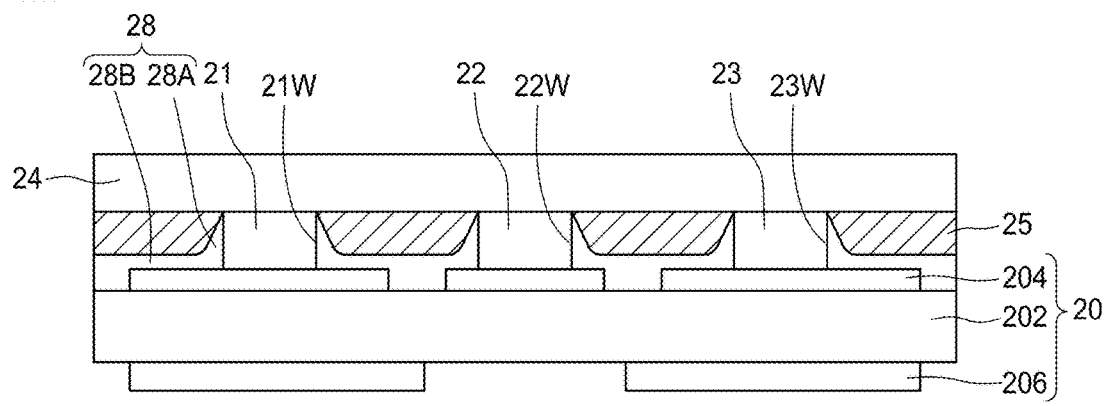
FIG. 7 shows a cross-sectional view of a structure of a pixel package in accordance with the fifth embodiment of the present disclosure.

FIG. 7 shows a cross-sectional view of a pixel package 2E according to an embodiment of the present disclosure. As shown in FIG. 7, the difference between the pixel package 2E and the pixel package 2D is that there is a reflective layer 28 between the light-absorbing layer 25 and the insulating layer 202 or the upper conductive layer 204 of the substrate 20. The reflective layer 28 includes a first portion 28A and a second portion 28B. The first portion 28A covers the insulating layer 202 and the upper conductive layer 204 of the substrate 20, and the second portion 28B covers the side walls 21W, 22W 23W of each light-emitting unit 21, 22, 23. The second portion 28B of the reflective layer 28 has the same structure and function as the reflective wall 27 of the pixel package 2D shown in FIG. 6A. The material of the reflective layer 28 is the same as the reflective wall 27 of the pixel package 2E. The light-absorbing layer 25 covers the reflective layer 28, so the top view of the pixel package 2E is same as that of the pixel package 2C shown in FIG. 4B. The detailed structures of light-emitting units 21, 22, 23 can be referred to the related descriptions of FIG. 3C or FIG. 4C.

Figure 8:
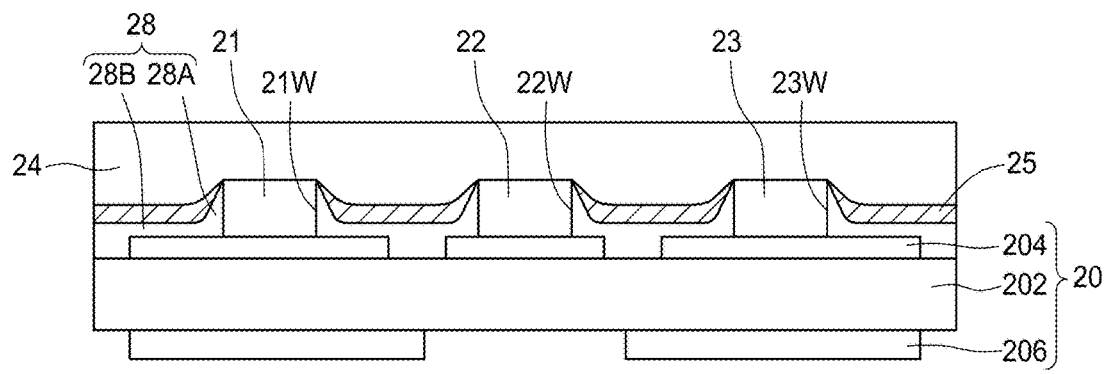
FIG. 8 shows a cross-sectional view of a structure of a pixel package in accordance with another fifth embodiment of the present disclosure.

FIG. 8 shows a structure of a pixel package 2E according to another embodiment. In this embodiment, the thickness of the light-absorbing layer 25 of the pixel package 2E is not uniform. The portion contacting the side walls 21W, 22W, 23W of the light-emitting units 21, 22, 23 of the light-absorbing layer 25 has a thickness larger than that of the portion away from the light-emitting units 21, 22, 23 of the light-absorbing layer 25. Similar to the light-absorbing layer 25 of the pixel package 2C shown in FIG. 5, the light-absorbing layer 25 of the pixel package 2E having a non-uniform thickness is caused by the surface tension during the manufacturing process.

The Multi-Pixel Package

Figure 9A:
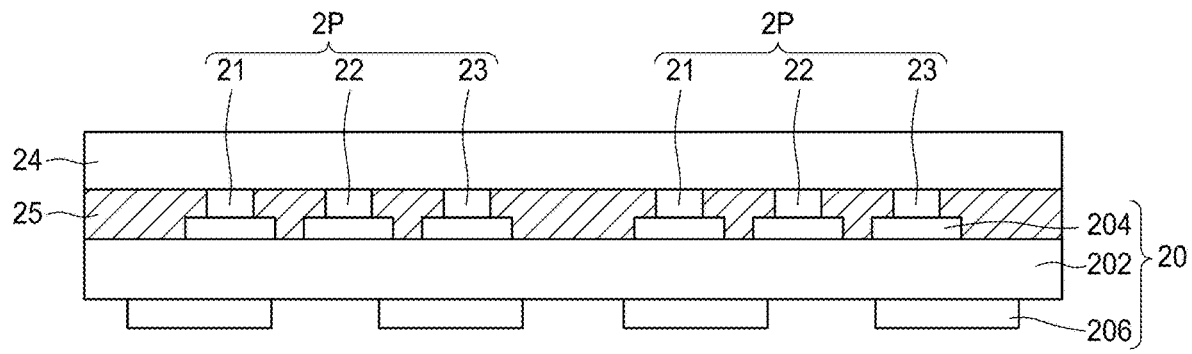
FIGS. 9A~9B show a structure of the multi-pixel package 2F in accordance with an embodiment of the present disclosure.
Figure 9B:
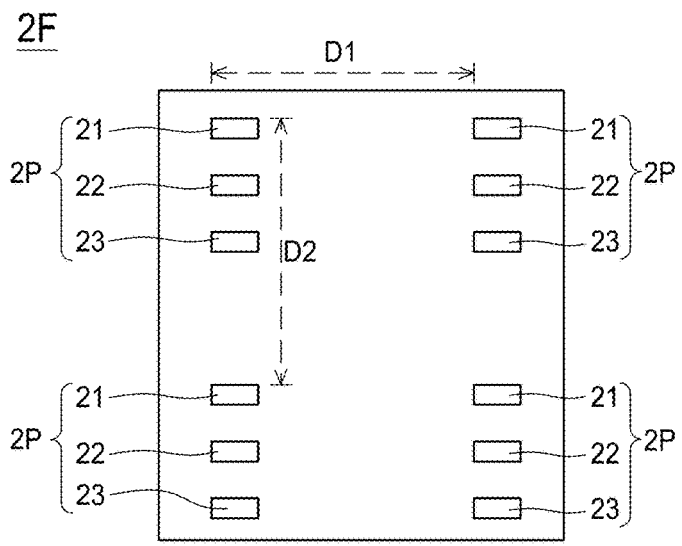

FIG. 9A shows a cross-sectional view of a multi-pixel package 2F according to an embodiment. FIG. 9B shows a top view of the multi-pixel package 2F. The multi-pixel package 2F has a similar structure to the second pixel package 2B shown in FIG. 3A. The difference is that the multi-pixel package 2F includes a plurality of pixels 2P. In this embodiment, the multi-pixel package 2F includes 4 pixels. In the multi-pixel package 2F, the distances between the light-emitting units 21, the light-emitting units 22, or the light-emitting units 23 of adjacent pixels 2P are the same. Each of light-emitting units 21 of different pixels 2P emits the light with the same wavelength. Each of light-emitting units 22 of different pixels 2P emits the light with the same wavelength. Each of light-emitting units 23 of different pixels 2P emits the light with the same wavelength. As shown in FIG. 9B, along the horizontal direction, the distance between two light-emitting units 21 of adjacent pixels 2P is D1. Along the vertical direction, the distance between two light-emitting units 21 of adjacent pixels 2P is D2. D1 is the same as D2. The detailed structures of light-emitting units 21, 22, 23 can be referred to the related descriptions of FIG. 3C or FIG. 4C.

Figure 10:
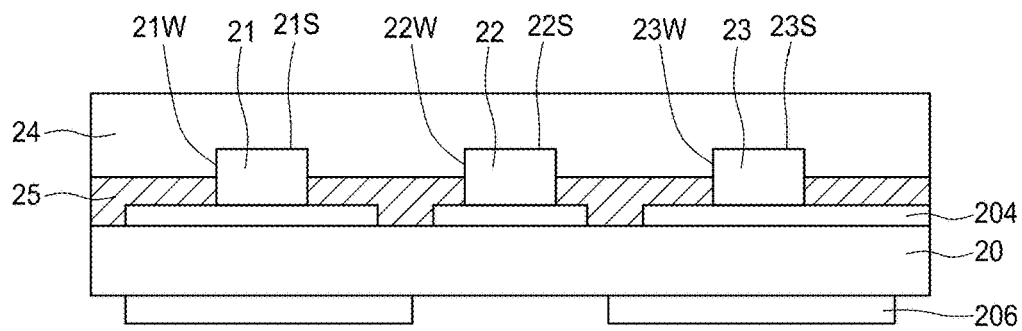
FIG. 10 shows a structure of the multi-pixels package 2F in accordance with an embodiment of the present disclosure.
Figure 11:
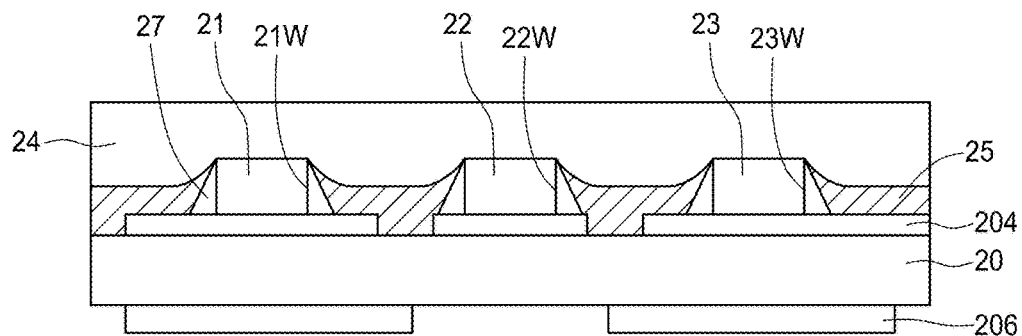
FIG. 11 shows a structure of the multi-pixels package 2H in accordance with an embodiment of the present disclosure.
Figure 12:
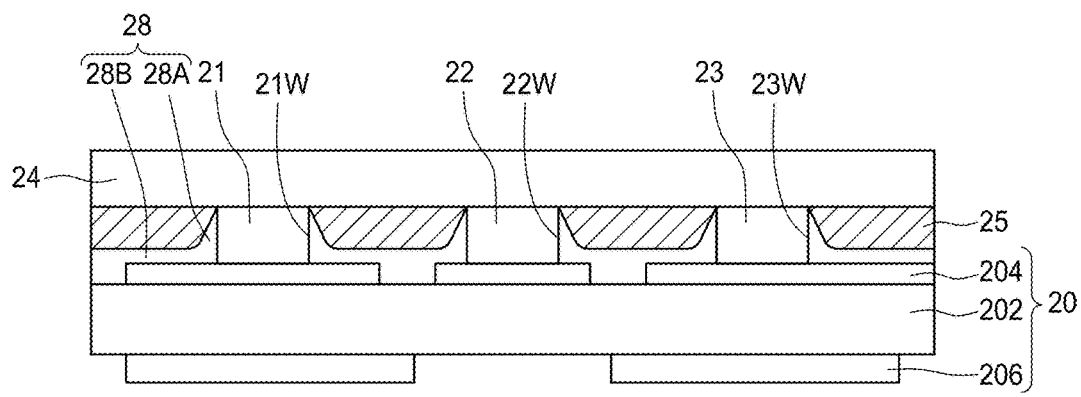
FIG. 12 shows a structure of the multi-pixels package 2I in accordance with an embodiment of the present disclosure.

In another embodiment, as shown in FIG. 10, the structure of the multi-pixel package 2G is similar to the pixel package 2C. The uppermost surface of the light-absorbing layer 25 is lower than the light-emitting surfaces 21S, 22S, 23S of the light-emitting units 21, 22, and 23. The side walls 21W, 22W, 23W of the light-emitting units 21, 22, and 23 are partially covered by the light-absorbing layer 25. As shown in FIG. 11, in another embodiment, the structure of the multi-pixel package 2H is similar to the pixel package 2D. A reflective wall 27 is formed on the side walls 21W, 22W, 23W of each light-emitting unit 21, 22, 23. The height of the reflective wall 27 is equal to or slightly lower than that of the light-absorbing layer 25 to avoid the external light from being reflected by the reflective wall 27. As shown in FIG. 12, in another embodiment, the structure of the multi-pixel package 2I is similar to the pixel package 2E, and the multi-pixel package 2I includes a reflective layer 28 between the light-absorbing layer 25 and the insulating layer 202 or the upper conductive layer 204 of the substrate 20. The structure and function of the reflective layer 28 can be referred to the above related descriptions of the pixel package 2E. The detailed structures of light-emitting units 21, 22, 23 can be referred to the related descriptions of aforementioned FIG. 3C or FIG. 4C.

The Display Module I

Figure 13:
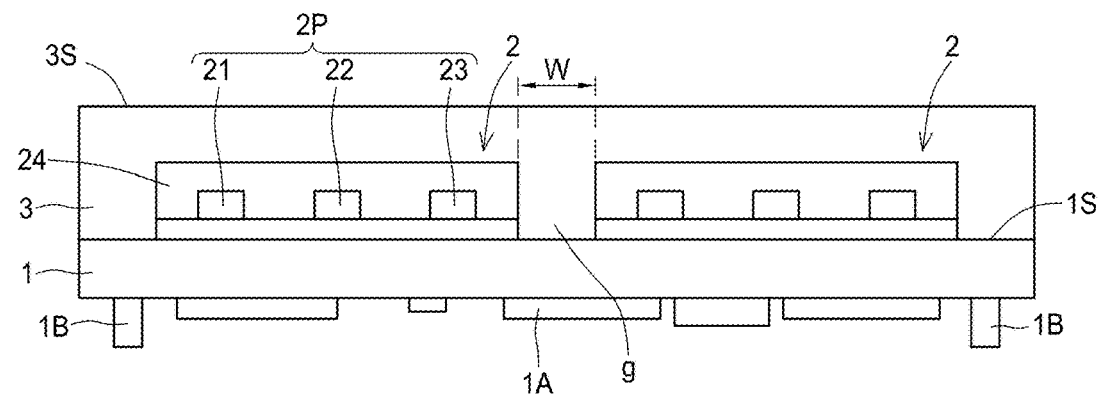
FIG. 13 shows a partially cross-sectional view of a display module 100 in accordance with an embodiment of the present disclosure.

FIG. 13 discloses a partial cross-sectional view of a display module 100 according to an embodiment of the present disclosure. The display module 100 includes a base 1 with a circuit, such as a PCB (print circuit board) or a glass circuit board, and a plurality of pixel packages 2 are located on a surface 1S of the base 1 and are connected to circuit of the base 1. The pixel package 2 includes the aforementioned pixel package 2A, 2B, 2C, 2D, 2E, or multi-pixel Package 2F. There is an aisle g between the adjacent pixel packages 2 to expose the surface 1S of the base 1. A light-transmitting protective layer 3 covers the plurality of pixel packages 2 and fills the aisle g for protecting the pixel packages 2. The aisle g between two adjacent pixel packages 2 has a width W, and the width W is greater than a certain value for mass production and/or user requirements. For example, the width W is greater than 1 μm. In case of failure, the defective pixel package 2 can be removed and a new pixel package 2 can be installed.

On the other side of the base 1 or the same side as the pixel 2P (not shown), a plurality of electronic components TA, such as a display controller, a capacitor, or a resistor, is electrically connected to the circuit of the base 1. The pixel package 2 receives the signal from the electronic component A through the circuit of the base 1 to control the light-emitting mode of the pixel 2P in the pixel package 2. In addition, the base 1 includes a plurality of pillars 1B for fixing the display module 100 on the predetermined positions and/or devices.

The material of the light-transmitting protective layer 3 includes transparent organic materials, such as silicone, epoxy, or combination thereof. The hardness is greater than the light-transmitting layer 24 of the pixel package 2 to protect the pixel package. The uppermost surface 3S of the light-transmitting protective layer 3 is a flat surface and is not easy to leave fingerprints. In an embodiment, the reflected glare of the display module 100 due to the external light reflected by the uppermost surface 3S of the light-transmitting protective layer 3 can be reduced by disposing an anti-reflection film on the light-transmitting protective layer 3 or adjusting the composition of the material of the light-transmitting protective layer 3.

The Display Module II

Figure 14:
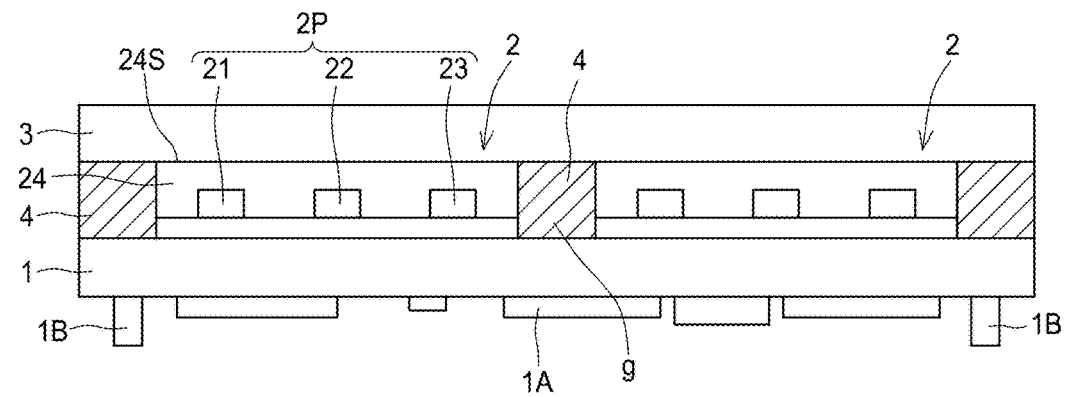
FIG. 14 shows a portion of a cross-sectional view of a display module 200 in accordance with an embodiment of the present disclosure.

FIG. 14 discloses a display module 200. The difference between the display module 200 and the display module 100 shown in FIG. 13 is a light-absorbing layer 4 with black or dark-colored surrounds the pixel package 2 and fills in the aisle g between two adjacent pixel packages 2. The light-absorbing layer 4 is filled to be flush with the uppermost surface 24S of the light-transmitting layer 24 of the pixel package 2 or slightly lower than the surface 24S of the light-transmitting layer 24. The material of the light-absorbing layer 4 includes matrix and black material. The matrix includes silicone, epoxy, or a mixture thereof, and the black material includes carbon black. The transmittance of the light-absorbing layer 4 is controlled by adjusting the concentration of the black material in the matrix. When the light-absorbing layer 4 is almost or completely opaque, the light emitted from the light-emitting unit 21, the light-emitting unit 22, and the light-emitting unit 23 of the pixel package 2 cannot penetrate the light-absorbing layer 4 toward the adjacent pixel package 2 to avoid crosstalk between adjacent the pixel packages 2 and increase the display contrast of the display module 200. A light-transmitting protective layer 3 is formed on the pixel packages 2 and the light-absorbing layer 4 to protect the pixel package 2. The material and characteristics of the light-transmitting protective layer 3 can be referred to the related descriptions of the display module 100. The hardness of the light-absorbing layer 4 is less than the hardness of the light-transmitting protective layer 3. For example, according to the measurement of shore D method, the Shore hardness of the light-absorbing layer 4 is less than 60, and the Shore hardness of the light-transmitting protective layer 3 is greater than 60. In another embodiment, according to the measurement of Mohs method, the Mohs hardness of the light-transmitting protective layer 3 is greater than 5 so the light-transmitting protective layer 3 has the ability to resist scratch.

In another embodiment, the light-absorbing layer 4 is affected by surface tension during the manufacturing process, and the uppermost surface of the light-absorbing layer 4 may appear concave (not shown). In another embodiment, a reflective layer (not shown) is formed between the light-absorbing layer 4 and the pixel package 2 to reflect the light emitted from the light-emitting unit 21, the light-emitting unit 22, and the light-emitting unit 23 to avoid being absorbed by the light-absorption layer 4.

The Display Module III

Figure 15:
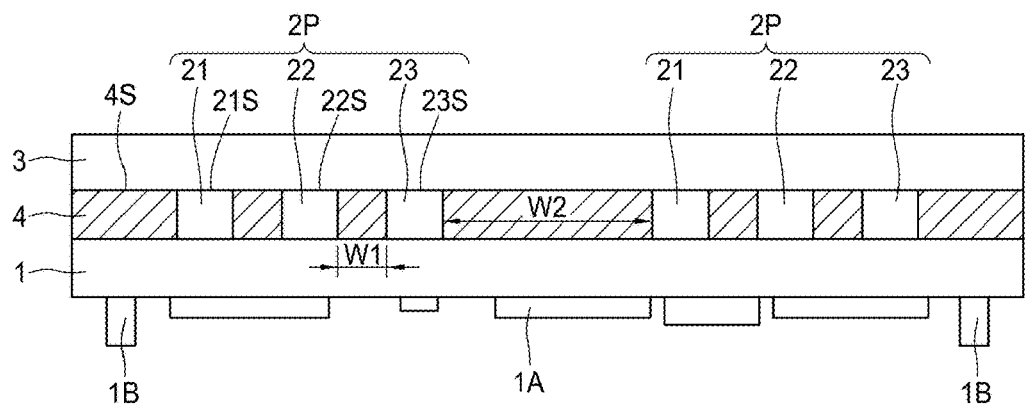
FIG. 15 shows a portion of a cross-sectional view of a display module 300 in accordance with an embodiment of the present disclosure.

FIG. 15 shows a display module 300. The difference between the display module 300 and the aforementioned display modules 100 and 200 is that the plurality of pixels 2P is directly disposed on the base 1. The pixel 2P includes the light-emitting unit 21, the light-emitting unit 22, and the light-emitting unit 23 electrically connected to the circuit (not shown) of the base 1. In each pixel 2P, there is a distance w1 between adjacent light-emitting units 21, 22, 23, and a distance w2 between adjacent pixels 2P. In one embodiment, the distance w1 is less than the distance w2. The light-absorbing layer 4 is directly formed on the base 1 and fills the space between adjacent pixels 2P and between adjacent light-emitting units 21, 22, 23 of each pixel 2P. The uppermost surface 4S of the light-absorbing layer 4 is flush with or slightly lower than the light-emitting surfaces 21S, 22S, 23S of the light-emitting units 21, 22, 23. A light-transmitting protective layer 3 is formed on the light-emitting units 21, 22, 23 and the light-absorbing layer 4 to protect the light-emitting units 21, 22, 23 and the light-absorbing layer 4. In the display module 300, the transmittance of the light-absorbing layer 4 is between 0% and 70%. The hardness of the light-absorbing layer 4 is less than the hardness of the light-transmitting protective layer 3. For example, according to the measurement of shore D method, the Shore hardness of the light-absorbing layer 4 is less than 60, and the Shore hardness of the light-transmitting protective layer 3 is greater than 60. In another embodiment, according to the measurement of Mohs method, the Mohs hardness of the light-transmitting protective layer 3 is greater than 5 so the light-transmitting protective layer 3 has the ability to resist scratch.

In another embodiment, the light-absorbing layer 4 is affected by surface tension during the manufacturing process, and the uppermost surface of the light-absorbing layer 4 may appear concave (not shown). In another embodiment, a reflective layer (not shown) is formed between the light-absorbing layer 4 and the side walls of each light-emitting unit 21, 22, 23 to reflect the light emitted from the light-emitting units 21, 22, 23 to avoid being absorbed by the light-absorption layer 4.

Encapsulating Process I

Figure 16A:
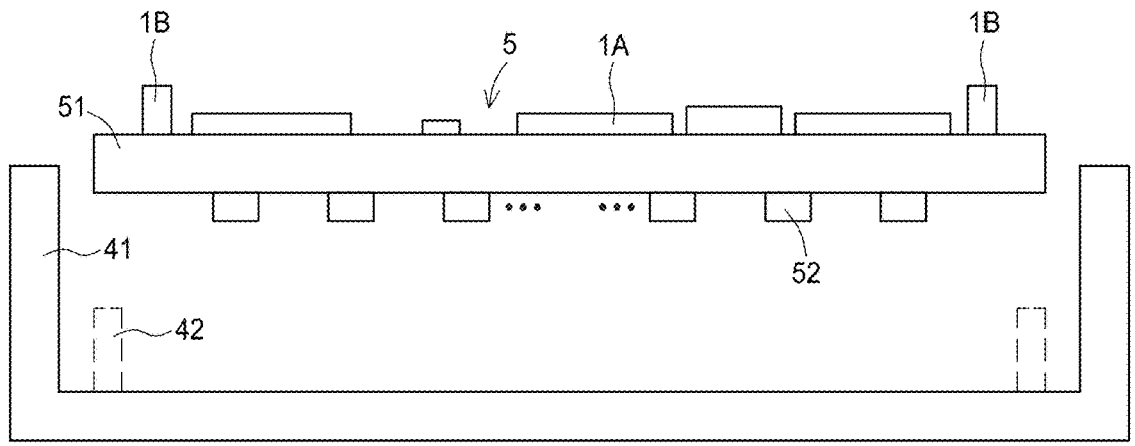
FIGS. 16A~16G show encapsulating process I in accordance with an embodiment of the present disclosure.
Figure 16B:
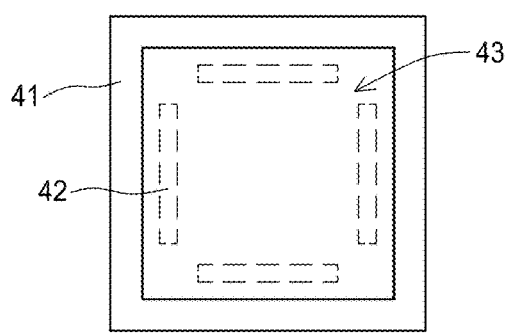

FIGS. 16A to 16F disclose the encapsulating process I in accordance with an embodiment of the present disclosure. As shown in FIG. 16A, a container 41 and a device 5 are provided. A plurality of supporting elements 42 are arranged in the container 41. As shown in FIG. 16B, the top view of the container 41, the supporting elements 42 are arranged in the peripheral area of the container 41, and a gap 43 is between the adjacent supporting elements. The device 5 includes a base 51 and a plurality of light-emitting elements 52 arranged on the base 51. As shown in FIG. 16A, the device 5 is turned upside down so that the light-emitting elements 52 face to the container 41 and are going to be placed in the container 41. The device 5 can be the pixel package 2A, 2B, 2C, 2D, 2E, multi-pixel package 2F, display module 100, display module 200, or display module 300. The base 51 can be the substrate 20 or base 1. The light-emitting element 52 can be the light-emitting units 21, 22, 23 or pixel packages 2A, 2B, 2C, 2D, 2E, 2F.

Figure 16C:
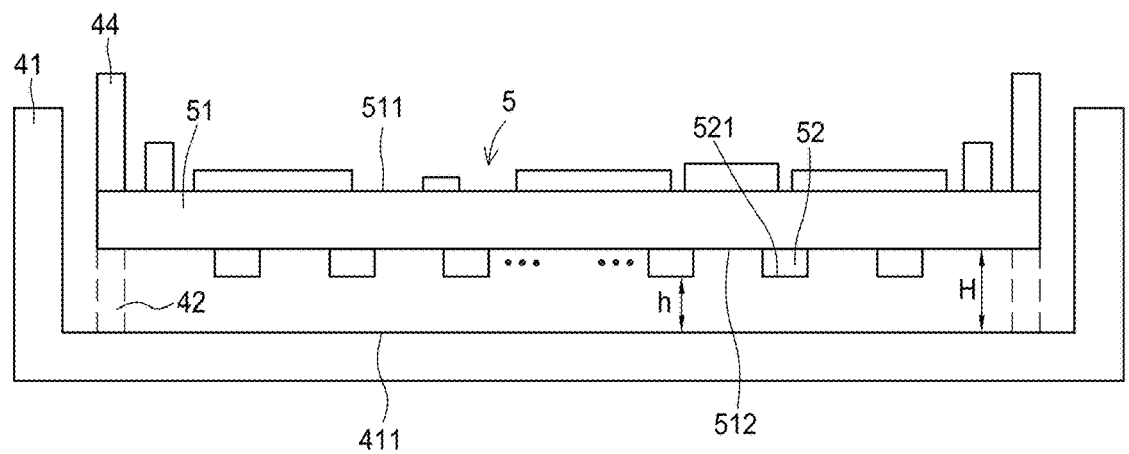
Figure 16D:
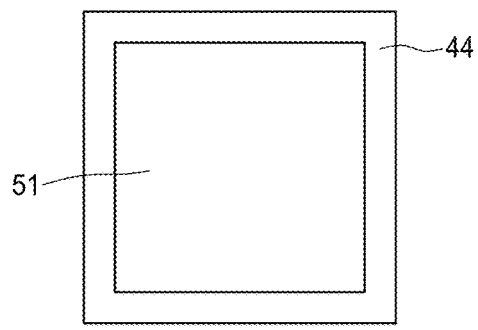

As shown in FIG. 16C, after the device 5 is placed in the container 41, the base 51 of the device 5 is supported by the supporting element 42. The supporting element 42 has a height H that can determine the distance h between the upper surface 521 of the light-emitting element 52 and the bottom surfaces 411 of the container 41. Then, on the back side of the base 51 opposite to the supporting element 42, a closing dam 44 is provided on the edge of back side 511 of the base 51. As shown in FIG. 16D, the dam 44 is disposed on the edge of the base 51.

Figure 16E:
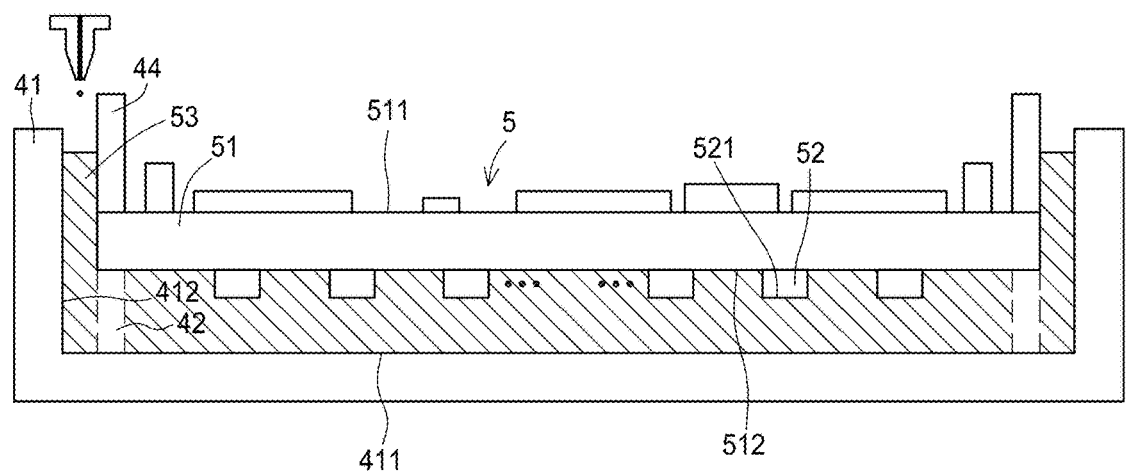
Figure 16F:
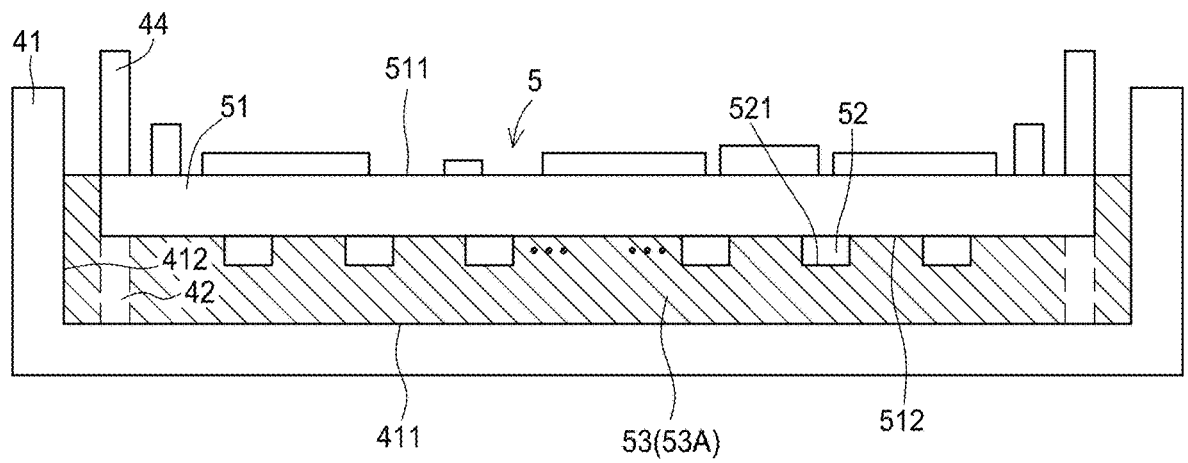
Figure 16G:
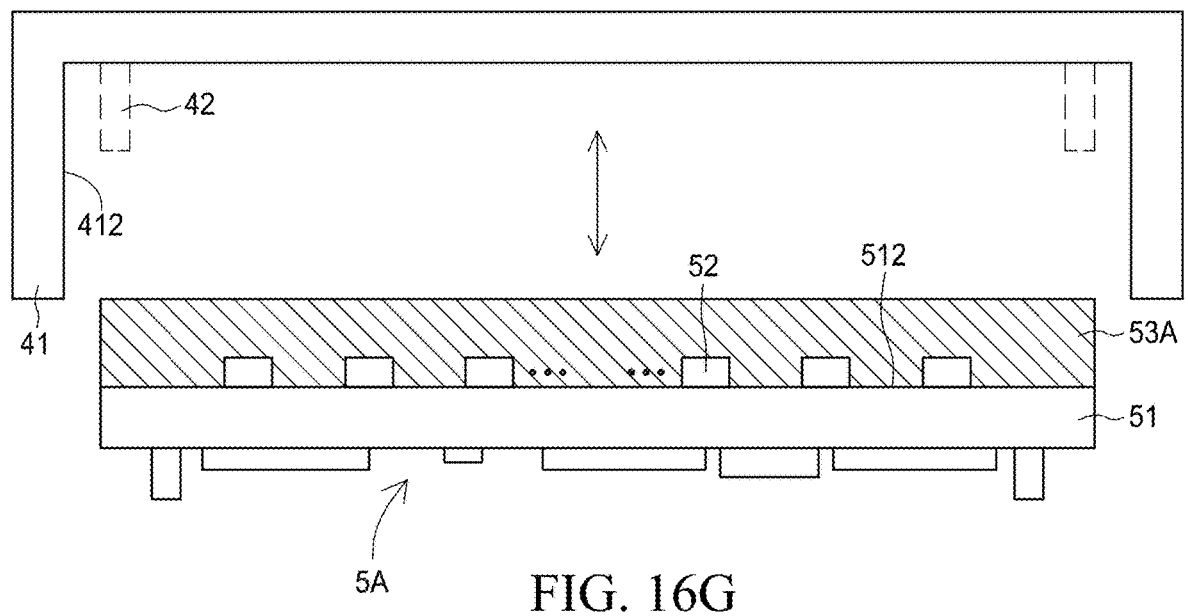

As shown in FIG. 16E, the liquid glue 53 is injected between the inner side surface 412 of the container 41 and the dam 44. Since the dam 44 is a closed structure, the liquid glue 53 does not flow to the back side 511 of the base 51. In one embodiment, the electronic component (IC) is disposed on the back side 511 of the base 51 to prevent the liquid glue 53 from damaging the electronic component (IC). Then, the liquid glue 53 flows from the gap 43 (as shown in FIG. 16B) between the adjacent supporting elements 42 to the space between the base 51 and the bottom surface 411 of the container 41. As shown in FIG. 16F, the space between the bottom surface 411 of the container 41 and the base 51 is evacuated and filled to full by the liquid glue 53. Then, the liquid glue is left to stand until the liquid glue 53 is cured to form a solid glue layer 53A. As shown in FIG. 16G, after the solid glue layer 53A is formed, the device 5A is removed from the container 41, the dam 44 on the base 51 is removed, and the shape of the solid glue layer 53A is modified to complete the encapsulating process. The manufacturing process of the solid glue layer 53A of this embodiment can be used to form the light-transmitting layer 24 of each pixel package and the light-transmitting protective layer 3 of each display module.

Encapsulating Process II

Figure 17A:
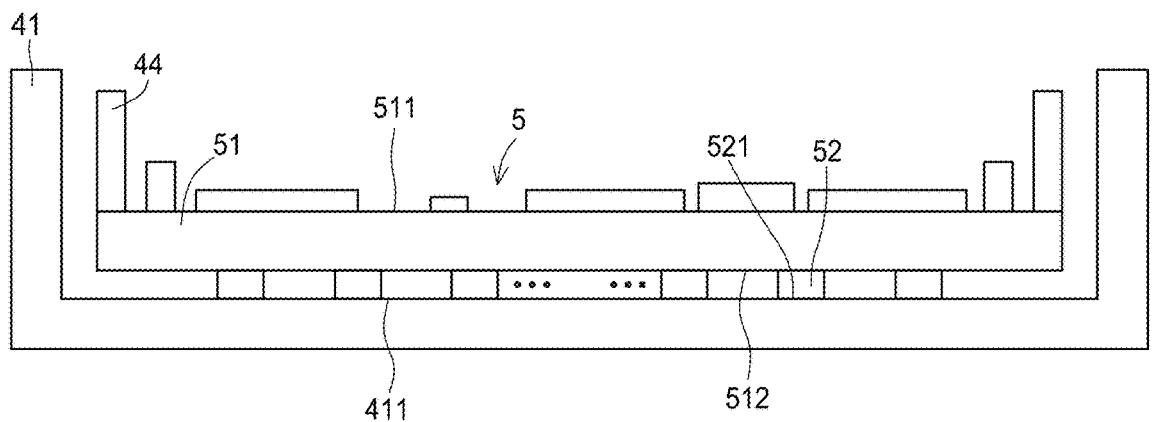
FIGS. 17A~17D show encapsulating process II in accordance with an embodiment of the present disclosure.
Figure 17B:
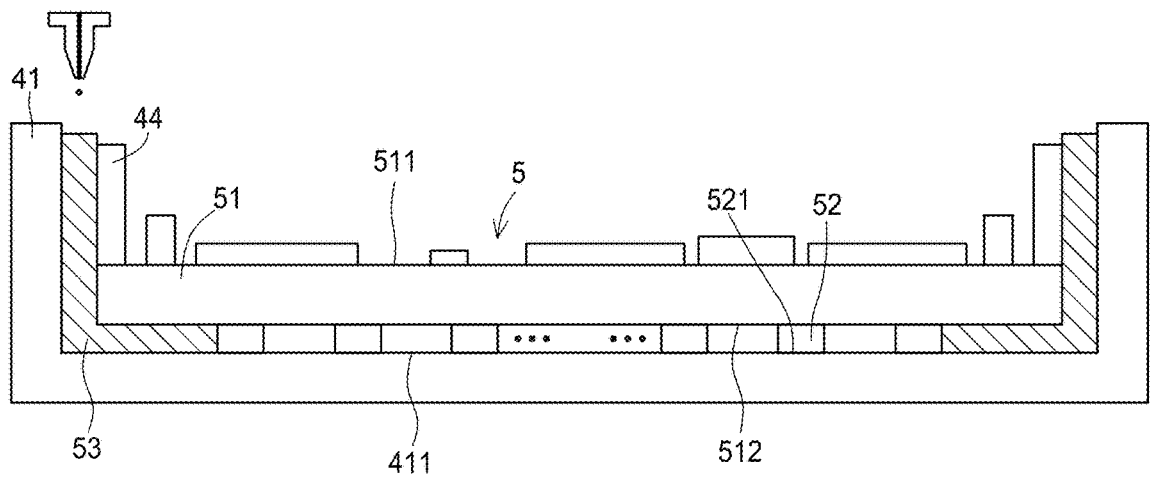
Figure 17C:
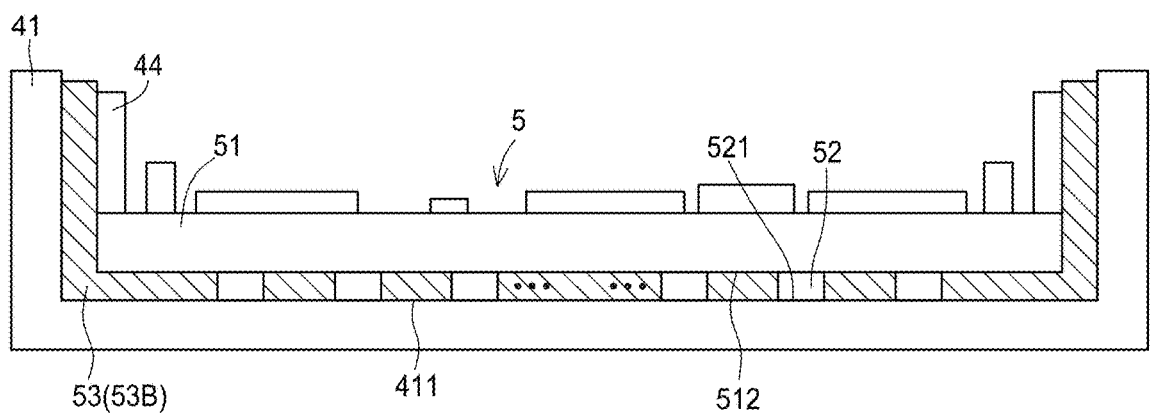
Figure 17D:
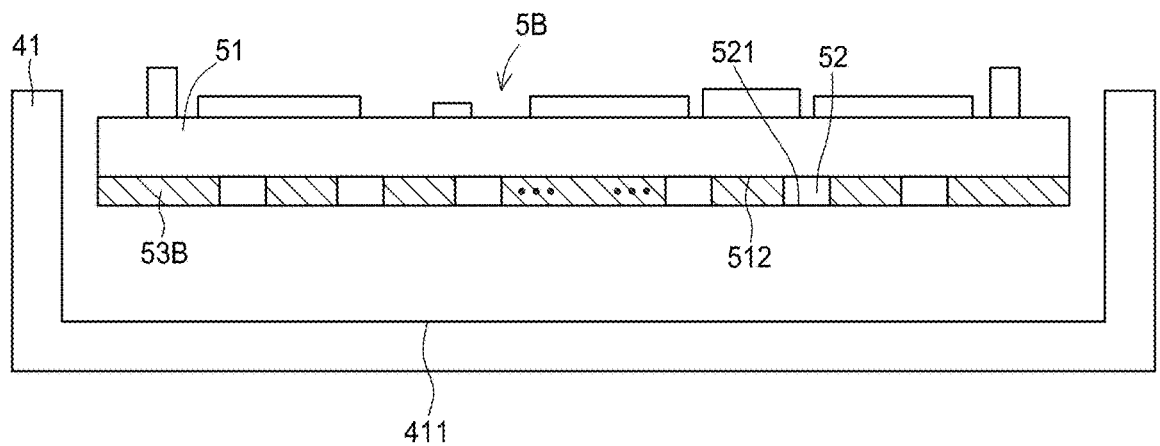

FIGS. 17A to 17D disclose the encapsulating process II in accordance with an embodiment of the present disclosure. The encapsulating process II is substantially same as the encapsulating process I. The difference is that the encapsulating process II does not provide the supporting element 42 on the bottom surface 411 of the container 41. As shown in FIG. 17A, when the device 5 is placed in the container 41, the upper surface 521 of the light-emitting element 52 is in contact with the bottom surface 411. Then, as shown in FIG. 17B, after the liquid glue 53 is injected, the liquid glue 53 flows into the space between the base 51 and the bottom surface 411 of the container until it is filled to full. Subsequently, the liquid glue 53 is left to stand until the liquid glue 53 is cured to form a solid glue layer 53B. Then, the device 5B is formed. As shown in FIG. 17D, the device 5B is removed from the container 41, and the solid glue layer 53B is flush with the upper surface 521 of the light-emitting element 52. In this embodiment, the solid glue layer 53B has a transparency of less than 50% for shielding the portion of the upper surface 512 without being covered by the light-emitting element 52 of the base 51. The manufacturing process of the solid glue layer 53B of this embodiment can be used to form the light-absorbing layer 25 of the pixel packages 2B, 2D, 2E, 2F, 2H, 2I and the light-absorbing layer 4 of the display modules 200 and 300.

Encapsulating Process III

Figure 18A:
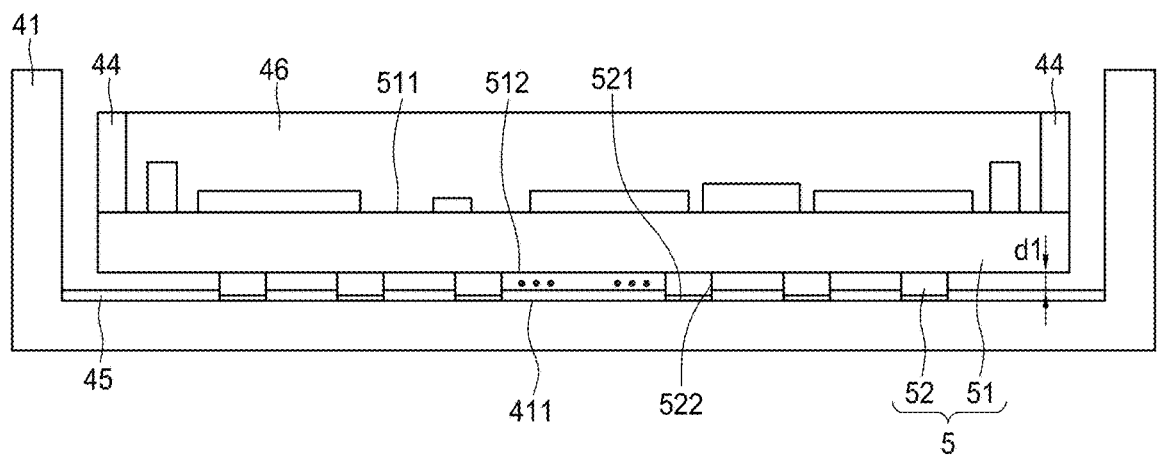
FIGS. 18A~18E show encapsulating process III in accordance with an embodiment of the present disclosure.

FIGS. 18A to 18E disclose the encapsulating process III in accordance with an embodiment of the present disclosure. The encapsulating process III is substantially the same as the encapsulating process I. As shown in FIG. 18A, the difference is that a barrier layer 45 is provided on the bottom surface 411 of the container 41. The barrier layer 45 includes a soft gel, such as a silicone rubber pad. Next, the device 5 is placed upside down on the barrier layer 45, so that the plurality of light-emitting elements 52 of the device 5 contacts the barrier layer 45. Then, a pressing element 46 is provided for pressing the back side 511 of the base 51 of the device 5 so a portion of each light-emitting element 52 is embedded into the barrier layer 45. Hence, the barrier layer 45 covers the upper surface 521 and a part of the side surface 522 of the light-emitting element 52. There is a distance d1 between the barrier layer 45 and the upper surface 512 of the base 51. In one embodiment, the material used for forming the barrier layer 45 can include a release agent so that the barrier layer 45 can be easily separated from the light-emitting element 52 after curing the liquid glue 53.

Figure 18B:
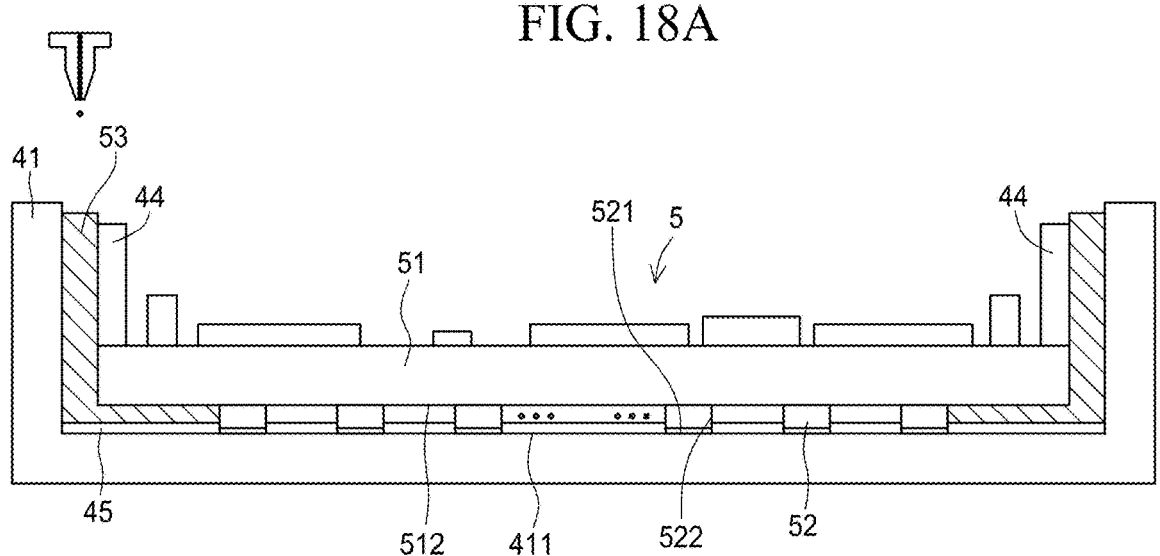
Figure 18C:
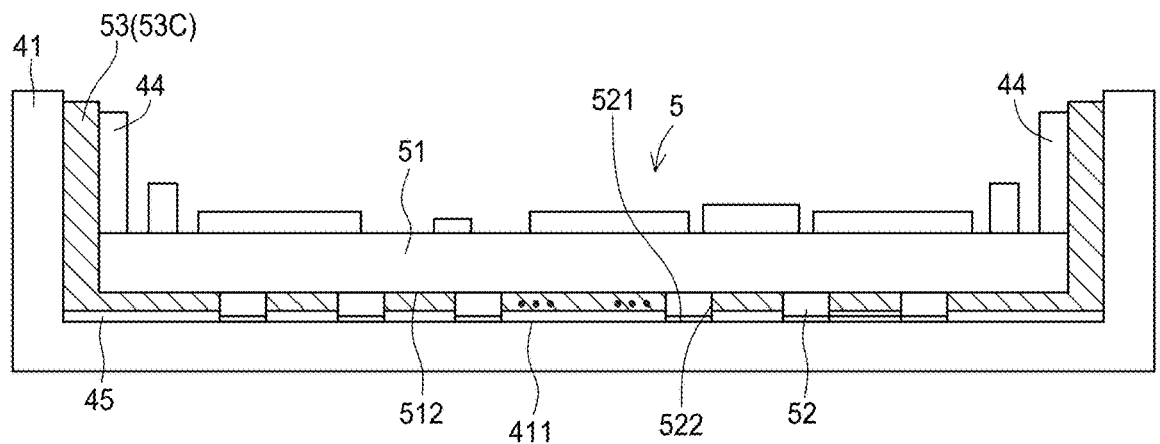
Figure 18D:
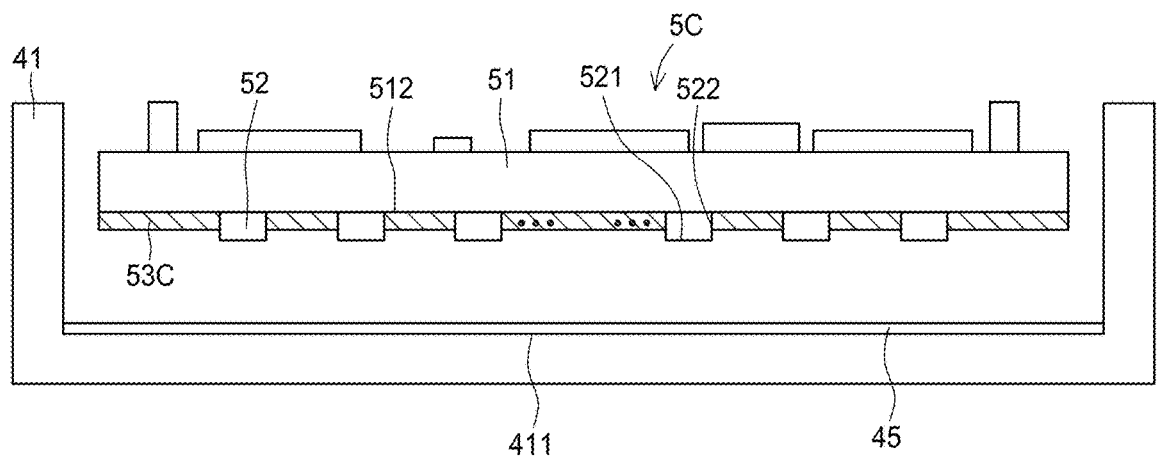

Next, as shown in FIG. 18B, the space between the barrier layer 45 and the base 51 is evacuated and is injected by the liquid glue 53 simultaneously. As shown in FIG. 18C, the solid glue layer 53C is formed after the liquid glue 53 is cured. Then, the demolding process is performed subsequently. As shown in FIG. 18D, after removing the device 5C from the container 41, the solid glue layer 53C is not flush with the upper surface 521 of the light-emitting element 52 and only covers part of the side surface 522 of the light-emitting element 52.

Figure 18E:
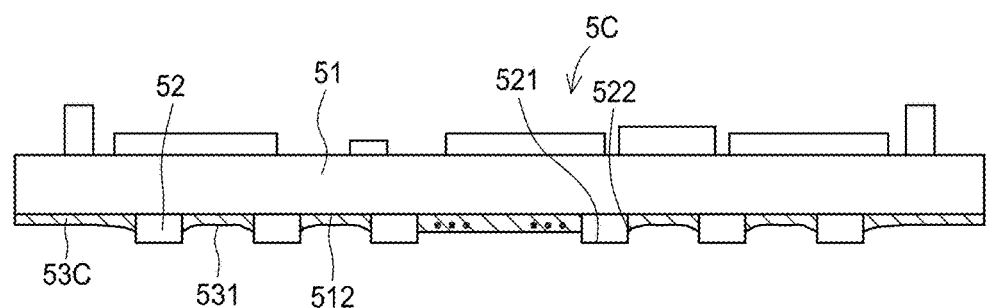

In another embodiment, as shown in FIG. 18E, in the step of FIG. 18A, since a portion of the light-emitting element 52 is embedded into the barrier layer 45, the surface of the barrier layer 45 may be uneven. The surface of the liquid glue 53 has a contour same as that of the barrier layer 45. After the subsequent step of curing the liquid glue 53 for forming the solid glue layer 53C, the upper surface 531 of the solid glue layer 53C has a concave shape between two adjacent light-emitting elements 52.

In this embodiment, the transparency of the solid glue layer 53C is less than 50% for shielding the portion of the upper surface 512 without being covered by the light-emitting element 52 of the base 51 and a portion of the side surface 522 of the light-emitting element 52. The manufacturing process of the solid glue layer 53C of this embodiment can be used to form the light-absorbing layer 25 of the pixel package 2C and the multi-pixel package 2G.

Encapsulating Process IV

Figure 19A:
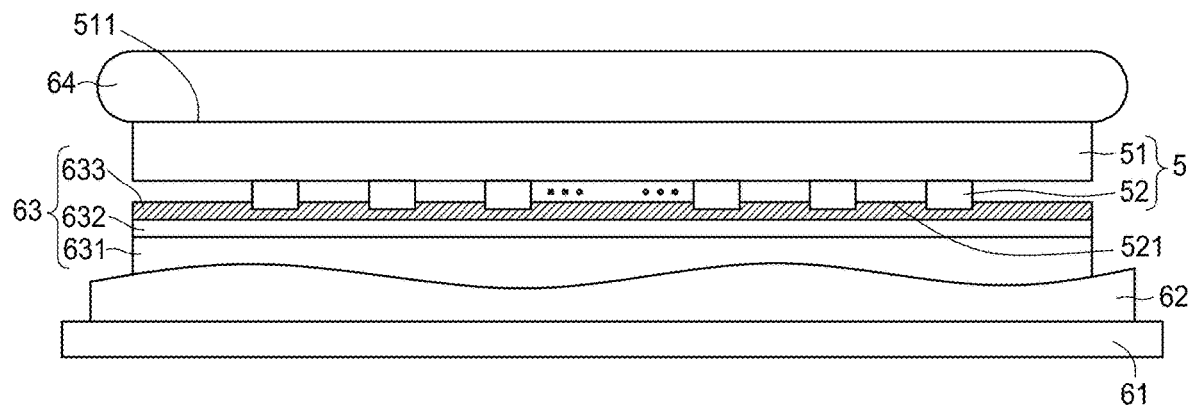
FIGS. 19A~19E show encapsulating process IV in accordance with an embodiment of the present disclosure.

FIGS. 19A to 19E disclose the encapsulating process IV in accordance with an embodiment of the present disclosure. As shown in FIG. 19A, a supporting base 61, such as a steel plate, is provided and a soft plate 62 are placed on the supporting base 61. A film 63 is placed on the soft plate 62. The film 63 includes a carrier film 631, an adhesive film 633, and a release layer 632 between the carrier film 631 and the adhesive film 633. The adhesive film 633 can be a B-stage (semi-cured) film, and includes the material including silicone, epoxy, polyurethane (PU), thermoplastic urethane (TPU), or combination thereof. The adhesive film 633 includes a transparent adhesive film or a colored adhesive film. The transparent adhesive film can be used to form the light-transmitting layer 24 of each pixel package and the light-transmitting protective layer 3 of each display module. The colored adhesive film can be used to form the light-absorbing layer 25 and the reflective layer 28. When the adhesive film 633 is the colored adhesive film and includes a black material, such as carbon black, the transmittance of the adhesive film 633 can be between 0% and 30% by controlling the concentration ratio of the black material to silicone or epoxy. When the adhesive film 633 is the colored adhesive film and includes reflective materials, such as titanium oxide ($TiO_x$), silicon oxide ($SiO_x$), or a combination thereof, the adhesive film 633 can have white or gray colors. As shown in FIG. 19A, the device 5 is placed upside down on the film 63 so that the upper surface 521 of each light-emitting element 52 contacts the adhesive film 633 of the film 63. an air pressure pad 64 is provided for give a pressure on the base 51 by pressing the back side 511 relative to the light-emitting element 52 of the base 51 (a side devoid of the light-emitting elements 52). Then, the light-emitting elements 52 are partially embedded into the film 63. During the manufacturing process, the adhesive film 633 is heated to be maintained in a softened state.

Figure 19B:
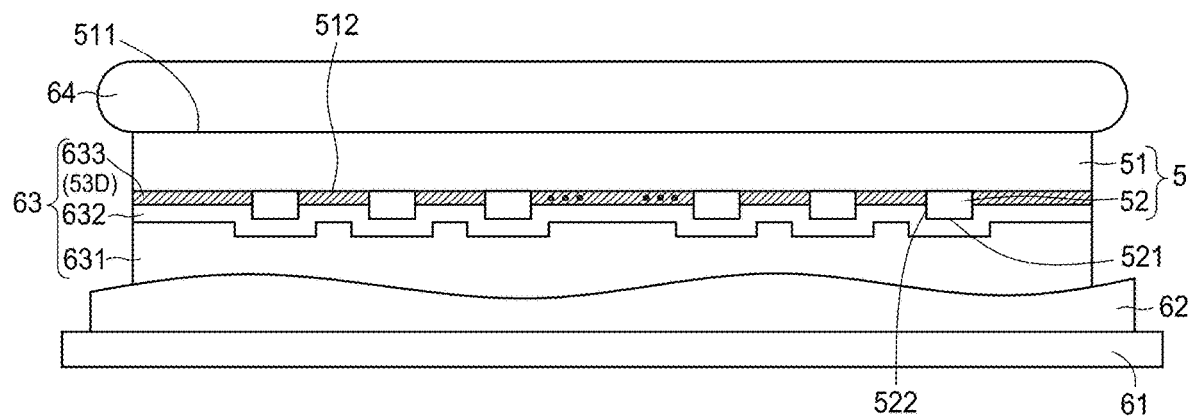
Figure 19C:
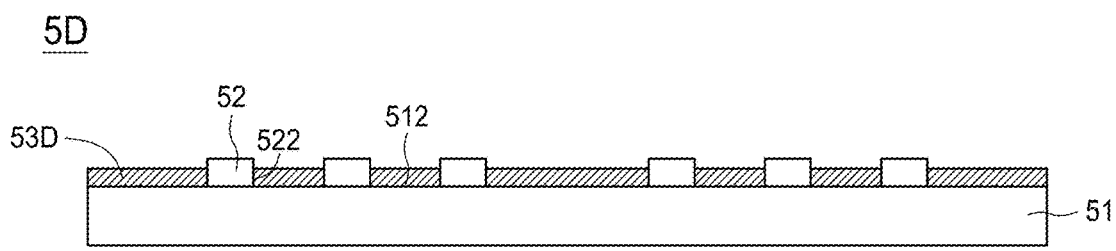
Figure 19D:
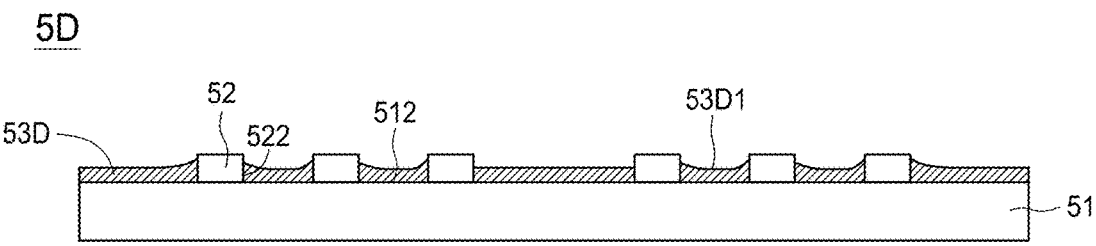

As shown in FIG. 19B, the softened adhesive film 633 is pressed into the space between two adjacent light-emitting element 52 by the air pressure pad 64 and the soft plate 62. In this embodiment, the air pressure pad 64 continuously provides the pressure until the softened adhesive film 633 fills in the space between two adjacent light-emitting elements 52 and exposes the upper surface 521 and/or part of the side surface 522 of the light-emitting element 52. After the adhesive film 633 fills the space between two adjacent light-emitting elements 52 with a predetermined thickness, the heating process is stopped for the adhesive film to stay for a while to be cured. After the adhesive film 633 is cured to form a solid adhesive layer 53D, the pressure of the air pressure pad 64 is released, and the release layer 632 and the carrier film 631 are removed to form a device 5D as shown in FIG. 19C. In this embodiment, the solid adhesive layer 53D has a transparency less than 50% and shields the portion of the upper surface 512 without being covered by the light-emitting element 52 of the base 51 and a portion of the side surface 522 of the light-emitting element 52. The manufacturing process of the solid adhesive layer 53D of this embodiment can be used to form the light-absorbing layer 25 of the pixel package 2C and the multi-pixel package 2G. In another embodiment, as shown in FIG. 19D, in the step shown in FIG. 19B, since the adhesive film 633 is softened and pressed by the soft plate 62, the softened adhesive film 633 between adjacent two light emitting elements 52 has a convex shape. Therefore, after cooling the adhesive film 633 and forming the solid adhesive layer 53D, the surface 53D1 of the solid adhesive layer 53D has concave shape between two adjacent light-emitting elements 52.

The thickness and color of the adhesive film 633 disclosed in this embodiment can be adjusted according to the application. Therefore, when the solid adhesive layer 53D is used to form the light-absorbing layer 4 of the pixel package 2B, 2D, 2E, 2F, 2H, 2I or the light-absorbing layer 25 of the display modules 200 and 300, the color of the adhesive film 633 can be black and the thickness of the adhesive film 633 can be less than the height of the light-emitting element 52. When the solid adhesive layer 53D is used to form the light-transmitting layer 24 of each aforementioned pixel packages or light-transmitting protective layer 3 of each aforementioned display module, the transparency of the adhesive film 633 can be adjusted between 30% and 100% and the thickness of the adhesive film 633 is greater than the height of the light-emitting element 52. When the solid adhesive layer 53D is used to form reflective layer 28 of the aforementioned pixel package, the adhesive film 633 includes reflective materials, such as $TiO_x$, $SiO_x$, or a combination thereof, and the thickness of the adhesive film 633 is less than the height of the light-emitting element 52.

Figure 19E:
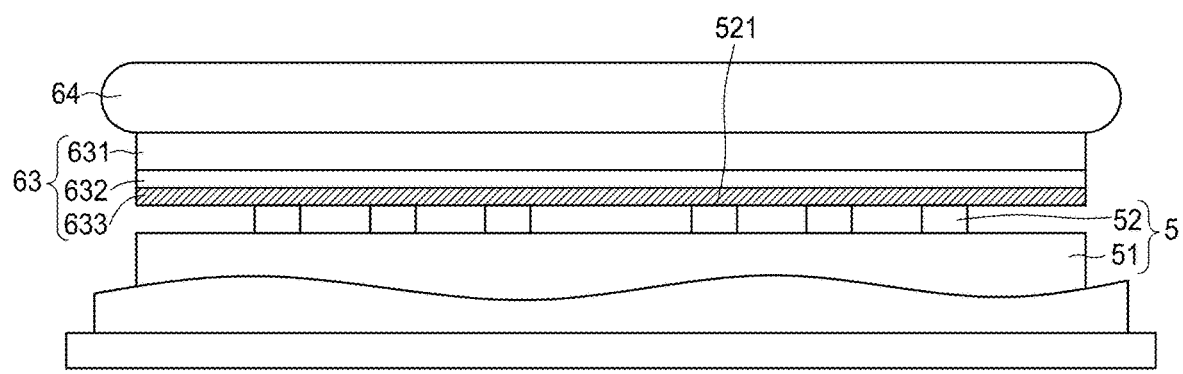

FIG. 19E shows another embodiment of the encapsulating process IV. The device 5 is placed on the soft plate 62, and the film 63 is placed on the light-emitting element 52. Therefore, the adhesive film 633 contacts the upper surface 521 of the light-emitting element 52. The air pressure pad 64 provides pressure on the carrier film 631 of the film 63. Then, the adhesive film 633 is heated and softened for filling into the space between two adjacent light-emitting elements 52. The subsequent steps are the same as aforementioned descriptions of FIG. 19B.

Encapsulating Process V

Figure 20A:
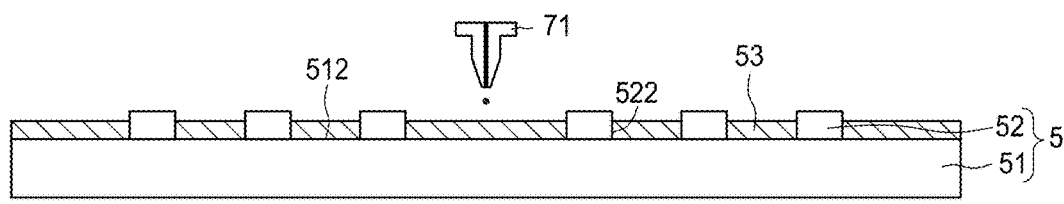
FIGS. 20A~20B show encapsulating process V in accordance with an embodiment of the present disclosure.
Figure 20B:
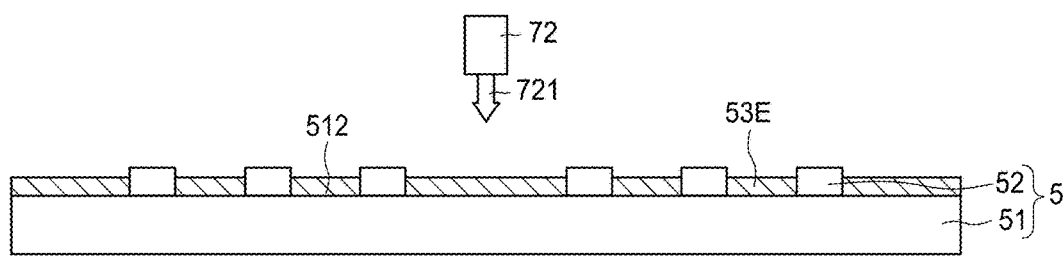

FIGS. 20A to 20B show another embodiment of the present disclosure of the encapsulating process. As shown in FIG. 20A, an ink jet printing device 71 is provided to spray the liquid glue 53 on the base 51 of the device 5. After the liquid glue 53 uniformly covers the upper surface 512 of the base 51 and the side surface 522 of the light-emitting element 52, as shown in FIG. 20B, an illumination device 72 is provided. The illumination device 72 provides a light 721, such as ultraviolet light with a wavelength between 300 nm and 400 nm to irradiate the liquid glue 53 for curing and forming a solid glue layer 53E. In another embodiment, the ink jet printing device 71 and the illumination device 72 can be a combined device. After the liquid glue 53 is sprayed on the base 51 of the device 5, the illumination device 72 simultaneously provides light 721 to cure the liquid glue 53 to form the solid glue layer 53E.

The material of the liquid glue 53 disclosed in this embodiment includes silicone, epoxy, or acrylic. The color and spraying thickness of the liquid glue 53 can be adjusted according to the application of the solid glue layer 53E. When the solid glue layer 53E is used as the light-absorbing layer 25 of the pixel packages 2B, 2D, 2E, 2F, 2H, 2I or the light-absorbing layer 4 of the display modules 200, 300, the color of the liquid glue 53 can be black. The liquid glue 53 only covers the side surface 522 of the light emitting element 52 without covering the upper surface 521 during manufacturing process. When the solid glue layer 53E acts as the transparent layer 24 of each pixel package and the light-transmitting protective layer 3 of each display module, the transparency of the liquid glue 53 can be between 30% and 100% and the liquid glue 53 can cover the upper surface 521 of the light emitting element 52 during manufacturing process. When the solid glue layer 53E acts as the reflective layer 28 and the reflective wall 27 of each pixel package, the liquid glue 53 includes a reflective material, such as $TiO_x$, $SiO_x$ or a combination thereof and the liquid glue 53 only covers the side surface 522 of the light emitting element 52 without covering the upper surface 521 during manufacturing process.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A package comprising:
   a substrate comprising a first surface and an upper conductive layer on the first surface;
   a first light-emitting unit disposed on the upper conductive layer and comprising a first semiconductor layer, a first substrate, a first light-emitting surface and a first side wall;
   a second light-emitting unit disposed on the upper conductive layer and comprising a second light-emitting surface and a second side wall;
   a light-transmitting layer disposed on the first surface and covering the upper conductive layer, the first light-emitting unit, and the second light-emitting unit; and
   a light-absorbing layer disposed between the substrate and the light-transmitting layer in a continuous configuration of separating the first light-emitting unit and the second light-emitting unit from each other,
   wherein the light-absorbing layer is directly connected to the upper conductive layer, the first side wall and the second side wall, and arranged to expose the first light-emitting surface and the second light-emitting surface, and
   wherein the light-absorbing layer has an uppermost surface which is lower than the first light-emitting surface and the second light-emitting surface, and higher than an interface between the first semiconductor layer and the first substrate.

2. The package according to claim 1, wherein the light-absorbing layer has a transmittance lower than that of the light-transmitting layer, , and higher than an interface between the first semiconductor layer and the first substrate.

3. The package according to claim 1, wherein the light-absorbing layer includes a carbon.

4. The package according to claim 1, wherein the light-absorbing layer and the light-transmitting layer include silicone, epoxy, or a combination thereof.

5. The package according to claim 1, wherein the substrate comprises an insulating layer, a lower conductive layer disposed under the insulating layer, and a plurality of conductive vias, wherein the upper conductive layer is disposed on the insulating layer, and the plurality of conductive vias is arranged to connect the upper conductive layer and the lower conductive layer.

6. The package according to claim 1, wherein the first light-emitting unit has a height h1, and the light-absorbing layer has a height h2, where $0.25 \times h1 \leq h2 \leq 0.75 \times h1$.

7. The package according to claim 1, wherein the first light-emitting unit and the second light-emitting unit are flip-chips.

8. The package according to claim 1, wherein the light-absorbing layer has a first thickness and a second thickness different from the first thickness.

9. The package according to claim 8, wherein the light-absorbing layer has a portion contacting the first side wall of the first light-emitting unit, and another portion away from the first light-emitting unit, the portion has a first thickness, the another portion has a second thickness, and the first thickness is larger than the second thickness.

10. The package according to claim 1, wherein the light-absorbing layer has a hardness less than that of the light-transmitting layer.

11. The package according to claim 1, further comprising a third light-emitting unit disposed on the substrate, wherein the first light-emitting unit, the second light-emitting unit, and the third light-emitting unit are arranged in a straight line.

* * * * *